(12) United States Patent
Nakazawa et al.

(10) Patent No.: US 6,867,077 B2
(45) Date of Patent: Mar. 15, 2005

(54) SEMICONDUCTOR DEVICE AND METHOD OF MANUFACTURING THE SAME

(75) Inventors: Misako Nakazawa, Tochigi (JP); Mitsuhiro Ichijo, Tochigi (JP); Toshiji Hamatani, Kanagawa (JP); Hideto Ohnuma, Kanagawa (JP); Naoki Makita, Nara (JP)

(73) Assignees: Semiconductor Energy Laboratory Co., Ltd., Kanagawa-ken (JP); Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/400,418

(22) Filed: Mar. 28, 2003

(65) Prior Publication Data

US 2003/0193052 A1 Oct. 16, 2003

(30) Foreign Application Priority Data

Apr. 11, 2002 (JP) ........................ 2002-109305

(51) Int. Cl.⁷ .................. H01L 21/00; H01L 21/84
(52) U.S. Cl. .................. 438/153; 438/154; 438/164
(58) Field of Search .................. 438/153–155, 438/158–159, 164, 166, 238, 471

(56) References Cited

U.S. PATENT DOCUMENTS

| 5,543,352 A | 8/1996 | Ohtani et al. |
| 5,612,250 A | 3/1997 | Ohtani et al. |
| 6,743,700 B2 * | 6/2004 | Asami et al. ............... 438/476 |

FOREIGN PATENT DOCUMENTS

| JP | 07-161634 | 6/1995 |
| JP | 10-022289 | 1/1998 |

* cited by examiner

Primary Examiner—Phat X. Cao
Assistant Examiner—Theresa T. Doan
(74) Attorney, Agent, or Firm—Nixon Peabody LLP; Jeffrey L. Costellia

(57) ABSTRACT

A barrier layer that meets three requirements, "withstand well against etching and protect a semiconductor film from an etchant as an etching stopper", "allow impurities to move in itself during heat treatment for gettering", and "have excellent reproducibility", is formed and used to getter impurities contained in a semiconductor film. The barrier layer is a silicon oxide film and the ratio of a sub-oxide contained in the barrier layer is 18% or higher.

38 Claims, 15 Drawing Sheets

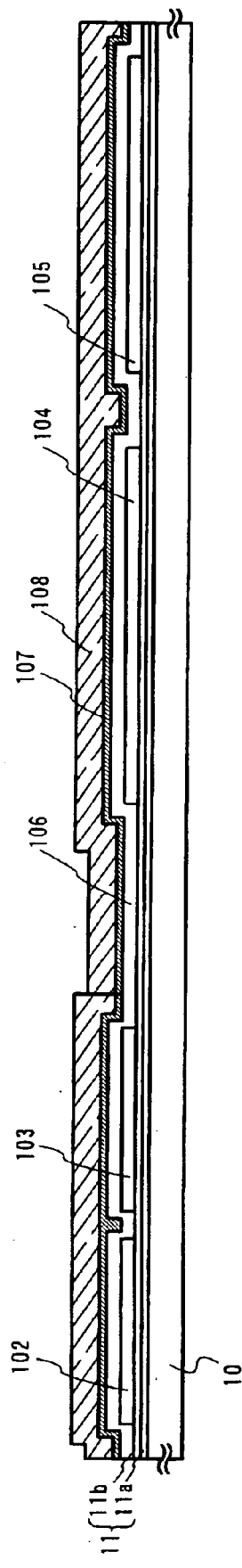
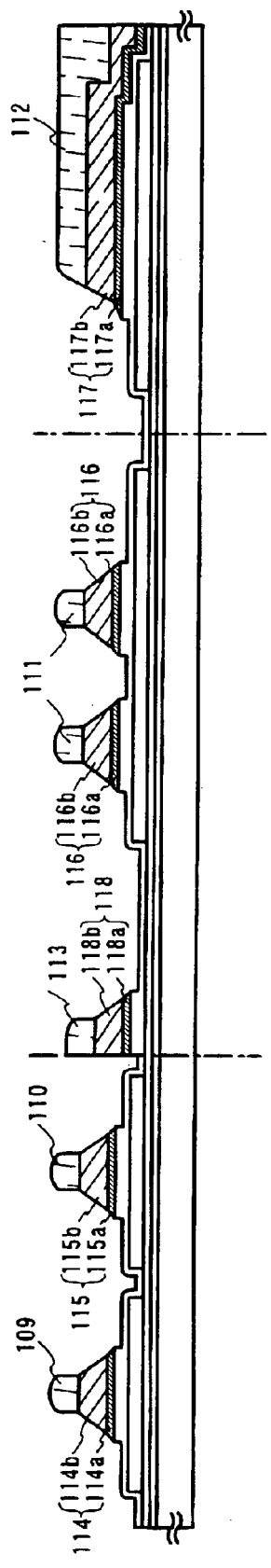
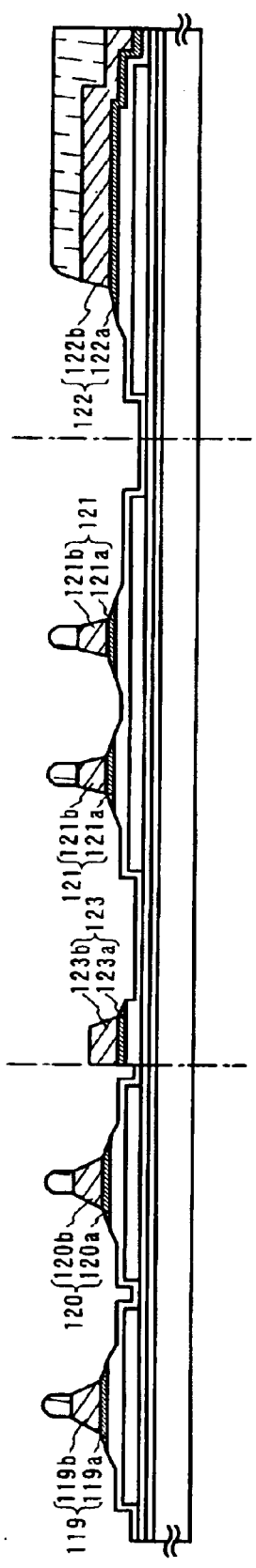
Fig. 5A
Fig. 5B
Fig. 5C

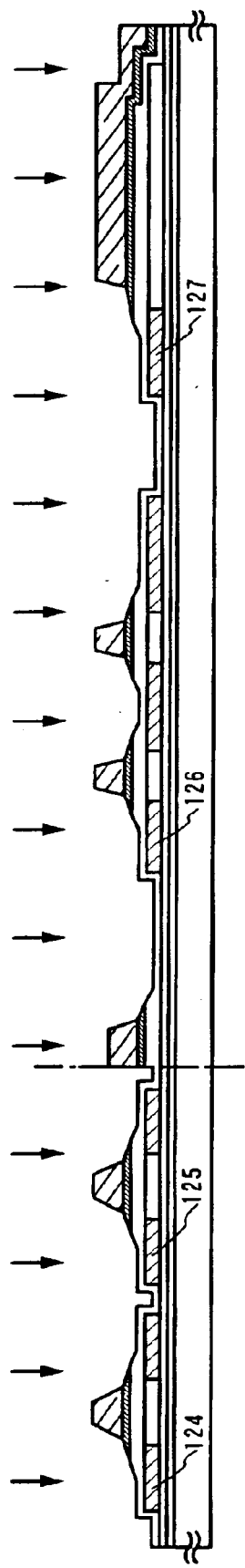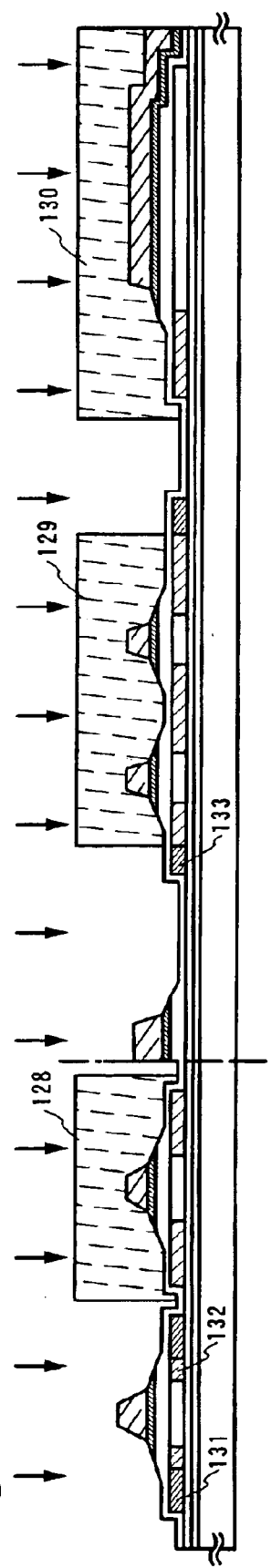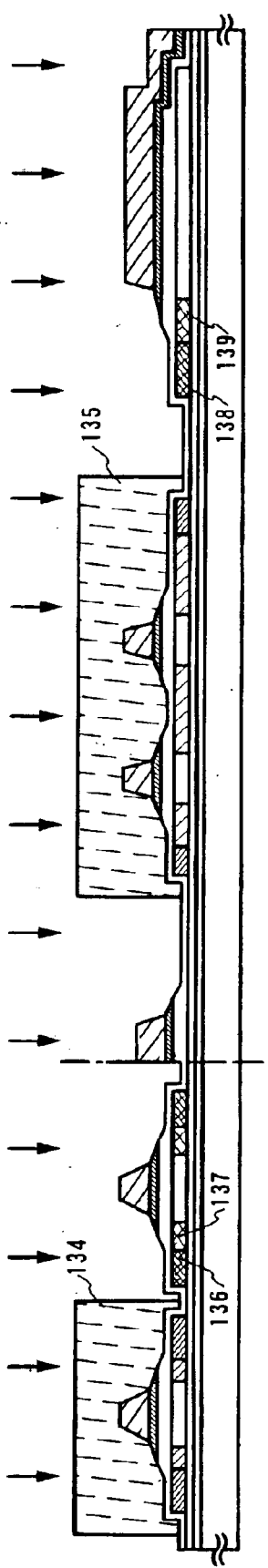

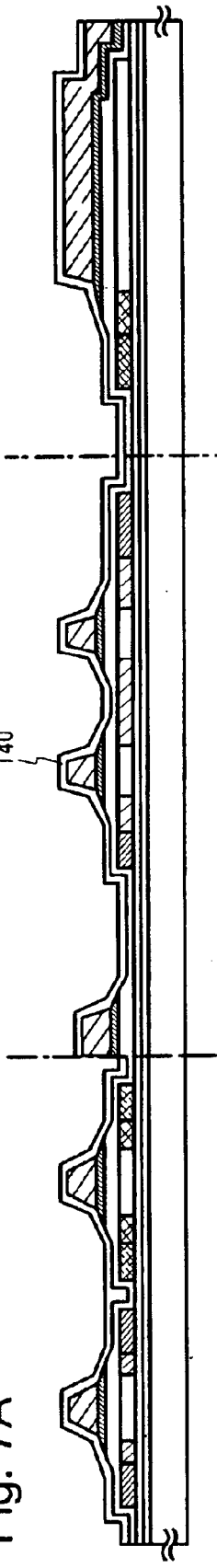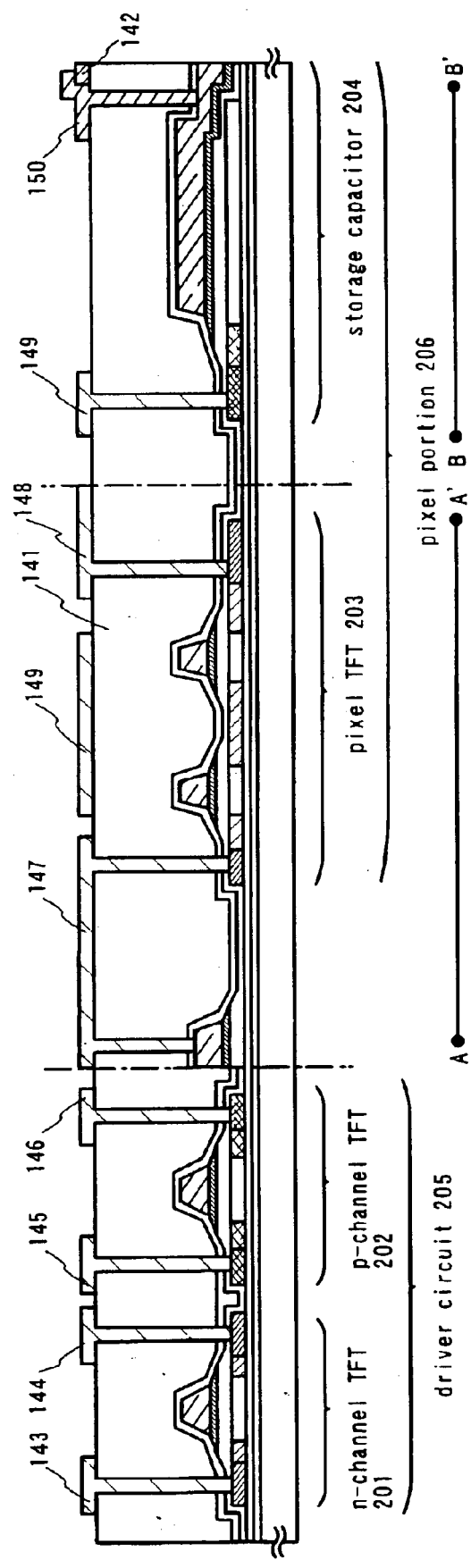
Fig. 7A
Fig. 7B

Distribution of concentration of Ni after gettering

SEMICONDUCTOR DEVICE AND METHOD OF MANUFACTURING THE SAME

BACKGROUND OF THE INVENTION

1. Field of the Invention

The present invention relates to a method of gettering an impurity element that is contained in a semiconductor film. Also, the present invention relates to a technique of manufacturing a highly reliable semiconductor device of excellent characteristics from a crystalline semiconductor film that is formed in accordance with the present invention.

2. Description of the Related Art

In order to improve the yield in manufacture of elements that utilize semiconductor characteristics, for example, thin film transistors (TFTs) and like other devices, and to make the devices more minute and sophisticated, it is important to develop a gettering technique for lowering the concentration of a heavy metal impurity element in a semiconductor film (a technique for moving an impurity element in a semiconductor film to a gettering region through diffusion induced by heat treatment). Ways to make devices smaller and improve their performance are constantly being researched and, as the size and weight are reduced, influence of a heavy metal impurity element inversely becomes larger. As a result, even a small amount of heavy metal impurity element in a device causes problems such as defects and leak current to degrade characteristics of the device and shorten the lifetime of the device.

Accordingly, technical development related to the gettering technique for reducing the impurity element concentration in a semiconductor is being actively advanced in order to improve the yield and obtain a high performance device.

The applicants of the present invention have disclosed in JP 07-161634 A and other published articles a method to obtain a quality crystalline semiconductor film. In this method, an amorphous semiconductor film (typically an amorphous silicon film) is doped with a metal element such as Ni, Cu, or Pd, and then subjected to heat treatment to form a quality crystalline silicon film that is large in grain size. The metal element used to dope the amorphous silicon film is called an element that accelerates crystallization or a catalytic element since its role is to accelerate crystallization. Ni given here as an example of the catalytic element (element that accelerates crystallization) is also one of the above-described heavy metal impurity elements that cause degradation of characteristics of semiconductors.

Therefore, the catalytic element should be removed from the crystalline semiconductor film (crystalline silicon film) (or the concentration of the catalytic element (element that accelerates crystallization) in the crystalline silicon film should be lowered) quickly after the crystallization step. Various gettering techniques have been devised to remove or reduce the catalytic element.

Techniques for gettering an impurity element (element that accelerates crystallization) can be divided by their gettering mechanisms into three types. Type 1 refers to those that make the impurity element diffuse, by heating, from a region that later serves as a channel formation region to a source region or drain region that contains an element having a gettering action (for example, an element belonging to Group 15 in the periodic table) in high concentration. Type 2 refers to those that make the impurity element diffuse, by heating, from an active layer region (especially a region that later serves as a channel formation region) to a gettering region which is outside of the active layer region and which contains an element having a gettering action (for example, an element belonging to Group 15 in the periodic table) in high concentration. Type 3 refers to those that make the impurity element diffuse, by heat treatment, from a first semiconductor film (a semiconductor film for forming an active layer) to a second semiconductor film (for example, a silicon film) that is formed on the first semiconductor film to serve as a gettering region.

Especially, Type 3, which moves the impurity element in the direction substantially perpendicular to the substrate for gettering (hereinafter referred to as vertical gettering), is deemed as a promising method to obtain a quality semiconductor film with low impurity element concentration because the distance the impurity element moves is short and this is advantageous in lowering the impurity element concentration in the semiconductor film satisfactorily.

JP 10-022289 A discloses a method of gettering an impurity element contained in a semiconductor film by forming an oxide film with a thickness of 1 to 5 nm on the semiconductor film, forming a film that contains silicon on the oxide film, and subjecting the film to heat treatment.

The oxide film on the semiconductor film functions as an etching stopper (etching block) when the gettering region is removed by etching after the heat treatment for gettering. For that reason, the oxide film is required to "withstand well against etching and protect the semiconductor film from an etchant as an etching stopper", "allow the impurity element to move in itself during heat treatment for gettering", and "have excellent reproducibility".

However, how the oxide film that meets the above requirements can be obtained is not mentioned in JP 10-022289 A although the publication states that an oxide film for effective gettering is 1 to 5 nm in thickness.

SUMMARY OF THE INVENTION

An object of the present invention is therefore to provide a method of forming a barrier layer that meets those requirements: "withstand well against etching and protect the semiconductor film from an etchant as an etching stopper", "allow the impurity element to move in itself during heat treatment for gettering", and "have excellent reproducibility", and to provide a method of forming a quality semiconductor film containing only a small amount of impurity element by using this barrier layer for gettering the impurity element in the semiconductor film.

In order to achieve the above-mentioned object, the present invention relates to a method of manufacturing a semiconductor device characterized by including: forming a first amorphous semiconductor film on an insulator; doping the first amorphous semiconductor film with an element that accelerates crystallization and subjecting the film to first heat treatment to form a crystalline semiconductor film; forming a barrier layer on the crystalline semiconductor film; forming a second amorphous semiconductor film on the barrier layer; and gettering through second heat treatment the crystallization accelerating element contained in the crystalline semiconductor film, in which the barrier layer is a film containing a sub-oxide.

Also, another aspect of the present invention relates to a method of manufacturing a semiconductor device characterized by including: forming a first amorphous semiconductor film on an insulator; forming a mask insulating film on the first amorphous semiconductor film, selectively doping the first amorphous semiconductor film with an element that accelerates crystallization, and subjecting the film to first heat treatment to form a crystalline semiconductor film; forming a barrier layer on the crystalline semiconductor film; forming a second amorphous semiconductor film on the barrier layer; and gettering through second heat treatment the crystallization accelerating element contained in the crystalline semiconductor film, in which the barrier layer is a film containing a sub-oxide.

Also, another aspect of the present invention relates to a method of manufacturing a semiconductor device characterized by including: forming a first amorphous semiconductor film on an insulator; doping the first amorphous semiconductor film with an element that accelerates crystallization and subjecting the film to first heat treatment to form a crystalline semiconductor film; forming a barrier layer on the crystalline semiconductor film; forming a second amorphous semiconductor film on the barrier layer; and gettering through second heat treatment the crystallization accelerating element contained in the crystalline semiconductor film, in which the barrier layer is an oxide film containing a sub-oxide, and the second amorphous semiconductor film contains an element that has a gettering action.

Also, another aspect of the present invention relates to a method of manufacturing a semiconductor device characterized by including: forming a first amorphous semiconductor film on an insulator; forming a mask insulating film on the first amorphous semiconductor film, selectively doping the first amorphous semiconductor film with an element that accelerates crystallization, and subjecting the film to first heat treatment to form a crystalline semiconductor film; forming a barrier layer on the crystalline semiconductor film; forming a second amorphous semiconductor film on the barrier layer; and gettering through second heat treatment the crystallization accelerating element contained in the crystalline semiconductor film, in which the barrier layer is an oxide film containing a sub-oxide, and the second amorphous semiconductor film contains an element that has a gettering action.

Also, in the above-mentioned aspects of the present invention, the method is characterized in that the barrier layer is a silicon oxide film, and that the ratio of the sub-oxide contained in the barrier layer is 18% or higher.

Also, in the above-mentioned aspects of the present invention, the method is characterized in that the ratio of the sub-oxide contained in the barrier layer is measured by ESCA (Electron Spectroscopy for Chemical Analysis).

Also, in the above-mentioned aspects of the present invention, the method is characterized in that the barrier layer is formed through oxidization by subjecting the surface of the crystalline semiconductor film to an aqueous solution that contains ozone.

Also, in the above-mentioned aspects of the present invention, the method is characterized in that the barrier layer is formed by plasma CVD using $SiH_4$ gas and $N_2O$ gas as material gas.

Also, in the above-mentioned aspects of the present invention, the method is characterized in that the element that has a gettering action is a noble gas element and is chosen from argon, xenon, krypton, and neon.

Also, in the above-mentioned aspects of the present invention, the method is characterized in that the element that has a gettering action is an element belonging to Group 15 in the periodic table.

Also, in the above-mentioned aspects of the present invention, the method is characterized in that the element that has a gettering action is an element belonging to Group 15 in the periodic table and an element belonging to Group 13 in the periodic table.

Also, in the above-mentioned aspects of the present invention, the method is characterized in that after the first heat treatment, the crystalline semiconductor film is irradiated with laser light.

Also, in the above-mentioned aspects of the present invention, the method is characterized in that after the second heat treatment, the second semiconductor film is removed by etching and then the barrier layer is removed.

Also, in the above-mentioned aspects of the present invention, the method is characterized in that the element that accelerates crystallization is one or more kinds of elements selected from the group consisting of Ni, Fe, Co, Sn, Pb, Ru, Rh, Pd, Os, Ir, Pt, Cu, and Au.

Also, the present invention relates to. a semiconductor device characterized by including a semiconductor layer, a gate insulating film, and a gate electrode that are formed on an insulating surface, in which the semiconductor layer contains an element that accelerates crystallization and the concentration of the element is graded in the thickness direction of the semiconductor layer.

Also, the present invention relates to a semiconductor device characterized by including a semiconductor layer, a gate insulating film, and a gate electrode that are formed on an insulating surface, in which the semiconductor layer contains an element that accelerates crystallization and the concentration of the element is graded in the thickness direction of the semiconductor layer, and the concentration of the element that accelerates crystallization is higher in the surface side of the semiconductor layer than in the substrate side of the semiconductor layer.

Also, in the above-mentioned aspects of the present invention, the method is characterized in that the element that accelerates crystallization is one or more kinds of elements selected from the group consisting of Ni, Fe, Co, Sn, Pb, Ru, Rh, Pd, Os, Ir, Pt, Cu, and Au.

Also, in the above-mentioned aspects of the present invention, the method is characterized in that the average surface roughness Ra of the surface of the semiconductor layer is 4.7 to 8.3 nm.

Through the above-described oxide film with 18% or more sub-oxide, a barrier layer that meets the requirements, "withstand well against etching and protect the semiconductor film from an etchant as an etching stopper" and "allow the impurities to move in itself during heat treatment for gettering" is realized. The above-described oxide film with 18% or more sub-oxide can be easily formed by application of water containing ozone or by TEOS-CVD after removing a natural oxide film that is formed on the surface of a crystalline semiconductor film (typically a crystalline silicon film) that is obtained by doping an amorphous semiconductor film with a crystallization accelerating element and subjecting the film to heat treatment. The oxide film thus exhibits excellent reproducibility in a process of manufacturing a semiconductor device.

BRIEF DESCRIPTION OF THE DRAWINGS

In the accompanying drawings:

FIGS. 5A to 5C are diagrams showing a process that is an embodiment of the present invention (Part 2);

FIGS. 6A to 6C are diagrams showing a process that is an embodiment of the present invention (Part 3);

FIGS. 7A and 7B are diagrams showing a process that is an embodiment of the present invention (Part 4);

DETAILED DESCRIPTION OF THE PREFERRED EMBODIMENTS

Embodiment 1

A method of removing a metal element used in crystallization (a catalytic element or an element that accelerates crystallization) from a semiconductor film in accordance with the present invention will be described. The description is given with reference to FIGS. 4A to 4D.

A silicon nitride film with a thickness of 100 nm is formed as a base insulating film 11 on a glass substrate 10. An amorphous silicon film 12 is successively formed to a thickness of 20 to 100 nm. The base insulating film 11 may have a laminate structure.

Figure 4A:
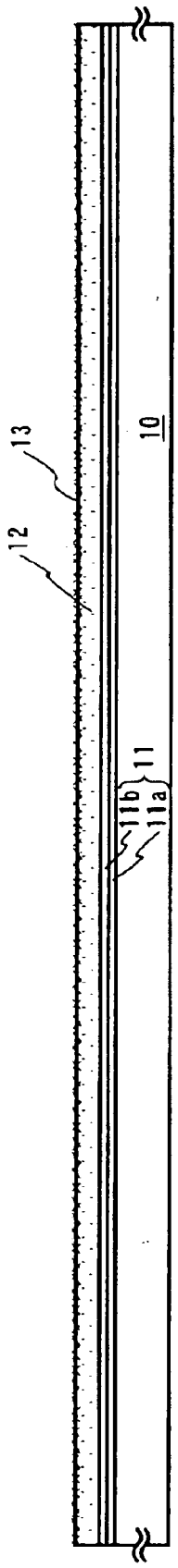
FIGS. 4A to 4D are diagrams showing a process that is an embodiment of the present invention (Part 1)
Figure 4B:
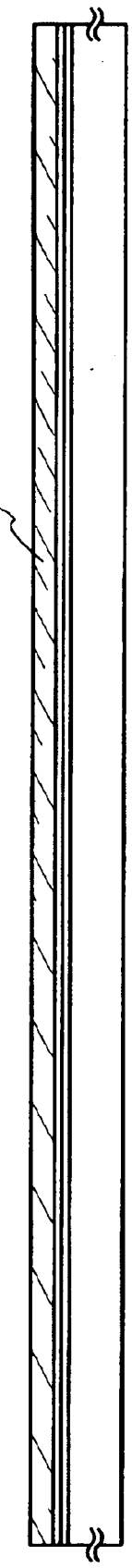
Figure 4C:
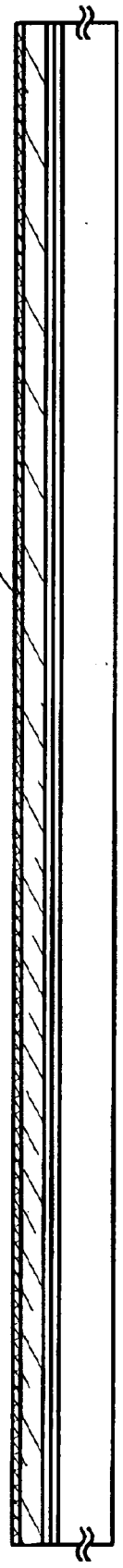

The amorphous silicon film 12 is doped with an element that accelerates crystallization (a catalytic element) to form a catalytic element-containing layer 13 for heat treatment. Here, the catalytic element-containing layer 13 is formed by using spin coating to apply an aqueous solution that contains 10 ppm by weight of a crystallization accelerating element (nickel in this embodiment) (a nickel acetate aqueous solution) to the amorphous silicon film 12. An element or elements that can be used to accelerate crystallization are selected from the group consisting of iron (Fe), nickel (Ni), cobalt (Co), tin (Sn), lead (Pb), ruthenium (Ru), rhodium (Rh), palladium (Pd), osmium (Os), iridium (Ir), platinum (Pt), copper (Cu), and gold (Au) (FIG. 4A). Instead of doping the amorphous silicon film 12 with nickel by spin coating, a thin film of an element that accelerates crystallization (here, a nickel film) may be formed on the amorphous silicon film 12 by evaporation or sputtering.

Prior to a crystallization step, the substrate is subjected to heat treatment at 400 to 500° C. for about an hour for dehydrogenation of the film and then to first heat treatment at 500 to 650° C. (preferably 550 to 570° C.) for 4 to 12 hours (preferably 4 to 6 hours). In this embodiment, heat treatment is conducted at 550° C. for 4 hours. As a result, a crystalline semiconductor film (crystalline silicon film, in this embodiment) 14 is formed. Although the film here is crystallized by heat treatment using a furnace, RTA (rapid thermal annealing) apparatus using a lamp or the like as a light source may be employed for the crystallization. The crystallinity of the crystalline silicon film 14 may be raised by irradiating it with laser light after the heat treatment. The laser light irradiation greatly improves the crystallinity of the crystalline silicon film. A pulse oscillation type KrF excimer laser (wavelength: 248 nm) can be employed for the laser light irradiation.

Subsequently, a barrier layer 15 is formed on the crystalline silicon film 14. Six different barrier layers are prepared in this embodiment as the barrier layer 15. How the six kinds of barrier layers are formed is shown in Table 1.

TABLE 1

| | | | Barrier layer forming conditions | | | |
|---|---|---|---|---|---|---|
| Types | (1) Hydroxide film | (2) $SiO_x$ | (3) TEOS (a) | (4) TEOS (b) | (5) $O_2$ plasma film (a) | (6) $O_2$ plasma film (b) |
| Forming conditions | Treatment time 60 sec. | depo time 20 sec. | depo time 15 sec. | depo time 2 sec. | depo time 60 sec. | depo time 60 sec. |
| | | Power 10 W/600 $cm^2$ press. 0.3 Torr | Power 150 W/600 $cm^2$ press. 0.3 Torr | Power 700 W press. 0.6 Torr | Power 100 W/600 $cm^2$ press. 0.3 Torr | Power 700 W press. 0.6 Torr |
| | Temp. RT | Temp. 400° C. spacing 25 mm | Temp. 400° C. spacing 26 mm | Temp. 377° C. spacing 500 mil. | Temp. 400° C. spacing 25 mm | Temp. 377° C. spacing 500 mil. |
| | Hydroxy concentration 14 mg/l | $SiH_4$ 4 sccm | $O_2$GAS 50 sccm | $O_2$GAS 3000 sccm | $O_2$GAS 100 sccm | $O_2$GAS 3000 sccm |
| | | $N_2O$ 800 sccm Pulse 1 kHz 30% | TEOS 10 sccm Pulse 1 kHz 10% | TEOS 145 sccm | | |

The hydroxide film denoted by (1) is specifically a silicon oxide film formed on the surface of the crystalline silicon film 14 (first semiconductor film) by removing a natural oxide film that is formed naturally on the surface of the crystalline silicon film and then subjecting the surface to ozone water that contains hydroxy radical (the hydroxy concentration: 14 mg/l) for about 60 seconds. Different film forming conditions (specifically, the flow rate ratio and film formation speed) produce films of different qualities (for example, the film density and component ratio) even when the same material gas is used. Accordingly, (3) TEOS (a), (4) TEOS (b), (5) an $O_2$ plasma treatment film (a), and (6) an $O_2$ plasma treatment film (b) are prepared.

On the barrier layer 15, a second semiconductor film 16 is formed as a gettering region. The second semiconductor film 16 is an amorphous silicon film formed by sputtering and contains argon as a noble gas element in a concentration of $1\times10^{19}$ to $1\times10^{22}/cm^3$.

The substrate is then subjected to second heat treatment to diffuse the crystallization accelerating element that is contained in the first semiconductor film 14 to the second semiconductor film 16 for gettering. The heat treatment is conducted at 550° C. for 4 hours using a furnace. If instead a method which uses radiant heat of light (with an infrared ray as a light source) as a heat source for instantaneous heat treatment or a method which uses heated inert gas (nitrogen, noble gas, or the like) as a heat source for instantaneous heat treatment is employed, the time required for heat treatment for gettering can be shortened.

Now, the six kinds of films are evaluated as the barrier layer 15 in context of gettering. How much of the impurity element (element that accelerate crystallization) in the crystalline silicon film (first semiconductor film) 14 is moved to the second semiconductor film 16 as a result of gettering is evaluated by measuring the concentration of the crystallization accelerating element remaining in the crystalline silicon film (first semiconductor film) 14 after the gettering step. Specifically, the concentration of the crystallization accelerating element remaining in the crystalline silicon film (first semiconductor film) 14 after diffusion through heat treatment is measured by total reflection X-ray fluorescence and the average value is obtained from measurements of six points within the plane. The lower measurement limit for Ni in total reflection X-ray fluorescence is $2.0\times10^9/cm^2$. The results of TXRF are shown in FIG. 1.

Figure 1:
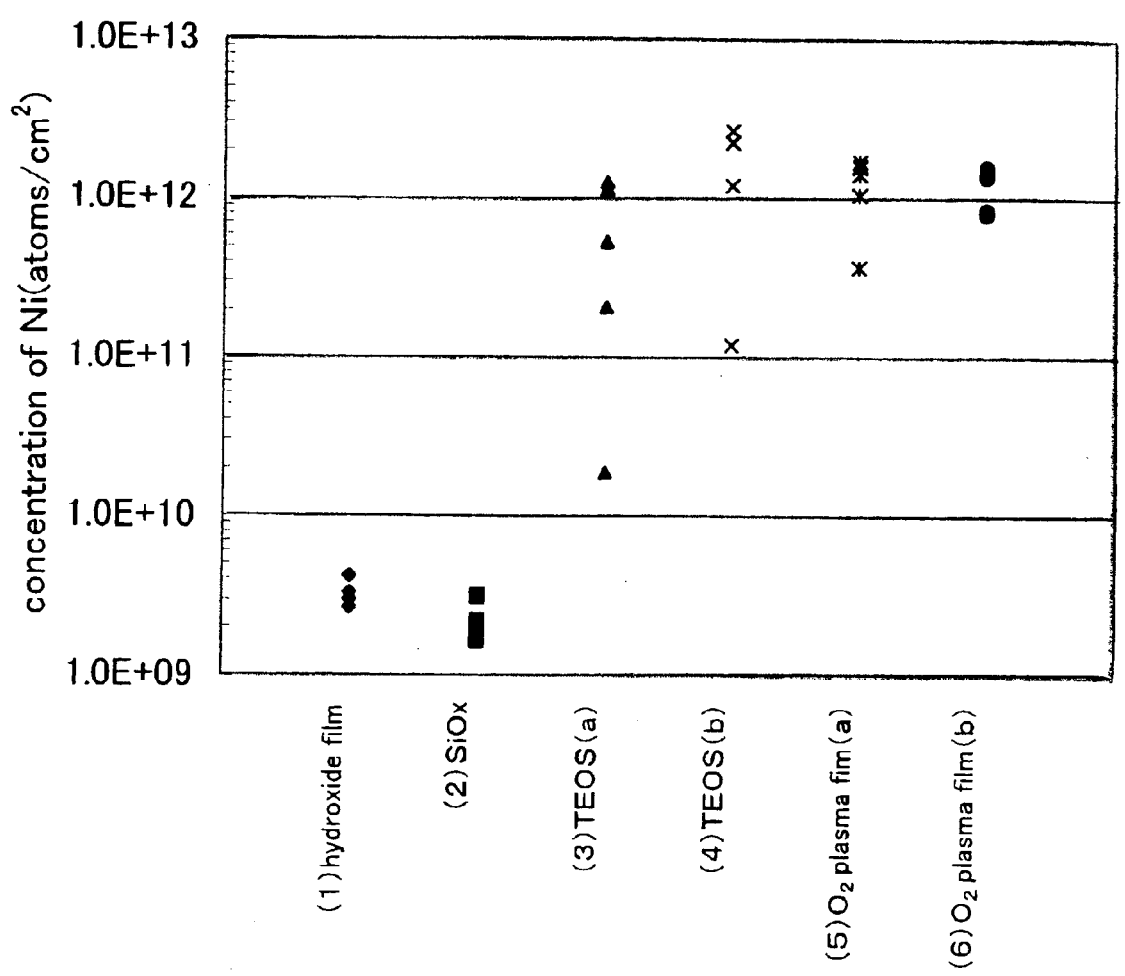
FIG. 1 is a graph showing results of comparing six kinds of barrier layers about the degree of gettering.

FIG. 1 shows that the barrier layer (1) and the barrier layer (2) are capable of reducing the concentration of the crystallization accelerating element sufficiently, down to $1\times10^{10}$ atoms/cm$^2$ or lower. It has thus been proved that the barrier layer (1) and the barrier layer (2) each "allow the impurity to move in itself during heat treatment for gettering".

The present inventors have performed ESCA (electron spectroscopy for chemical analysis) on each of the six kinds of barrier layers (insulating films containing silicon) to examine difference between them. ESCA is photoelectron spectroscopy using soft X-rays for excitation. In ESCA, the kinetic energy of a photoelectron released when a sample is irradiated with soft X-rays is measured to measure the bond energy unique to the atom, and the electron state is read from the slightest change in bond energy.

Figure 2:
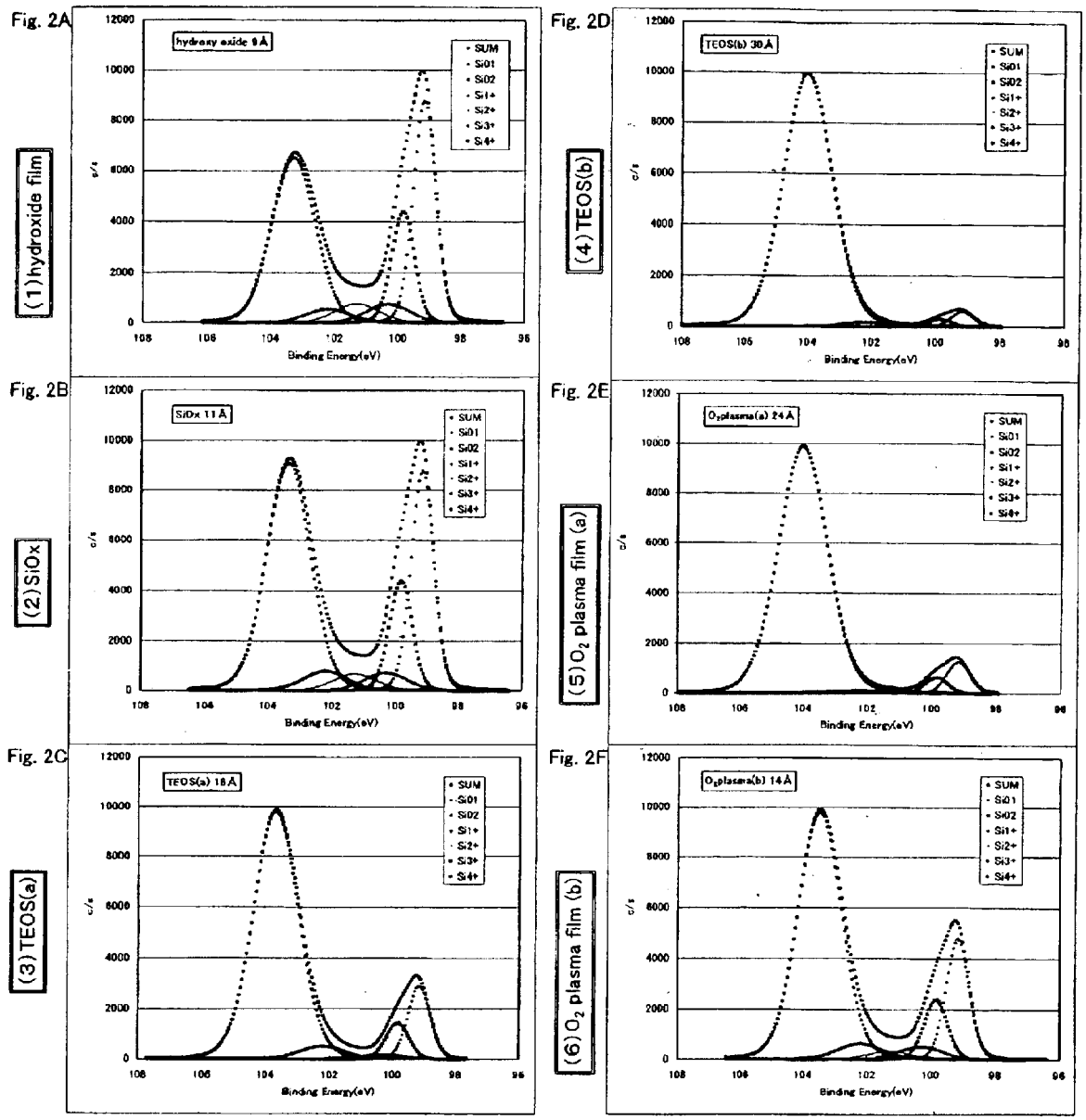
FIGS. 2A to 2F are graphs showing results of ESCA performed on the barrier layers.
Figure 3:
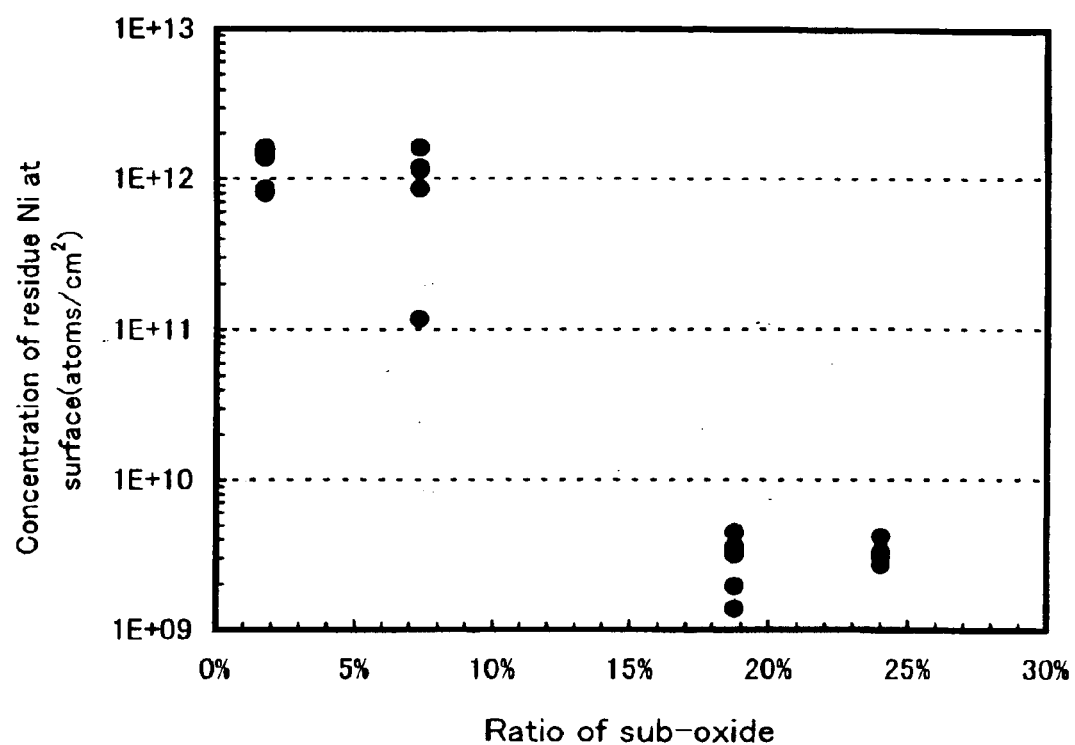
FIG. 3 is a graph showing the ratio of a sub-oxide contained in a barrier layer.

FIGS. 2 and 3 show results of analyzing the six kinds of barrier layers by ESCA. The results in FIGS. 2 and 3 are expressed in numerical values in Table 2.

TABLE 2

| Barrier layer types | sub-oxide | | | Si$^{4+}$ | Total % |
|---|---|---|---|---|---|
| | Si$^{1+}$ | Si$^{2+}$ | Si$^{3+}$ | | |
| (1) hydroxide film | 8.8% | 8.8% | 6.4% | 76.0% | 100% |
| (2) SiO$_x$ | 6.3% | 5.8% | 6.7% | 81.2% | 100% |
| (3) TEOS (a) | 1.8% | 0.9% | 4.6% | 92.7% | 100% |
| (4) TEOS (b) | 0.0% | 0.0% | 1.3% | 98.7% | 100% |
| (5) O$_2$ plasma film (a) | 0.4% | 0.4% | 0.9% | 98.2% | 100% |
| (6) O$_2$ plasma film (b) | 4.5% | 2.7% | 5.4% | 87.5% | 100% |

From those results, the present inventors have found that the sub-oxide ratio is higher in a film evaluated high in terms of gettering (a film that has been successful in lowering the concentration of the catalytic element remaining in the first crystalline semiconductor film) than in a film evaluated low in terms of gettering (a film that has not been successful in lowering the concentration of the catalytic element remaining in the first crystalline semiconductor film). Silicon oxide obtained by coupling of silicon with four oxygen atoms, which is the most reasonable bonding, is expressed as Si$^{4+}$. Silicon oxide in which one out of four bonds of silicon is bonded to oxygen is expressed as Si$^{1+}$. Silicon oxide in which two out of four bonds of silicon are bonded to oxygen is expressed as Si$^{2+}$. Silicon oxide in which three out of four bonds of silicon are bonded to oxygen is expressed as Si$^{3+}$. Si$^{n+}$ that is not Si$^{4+}$ is called a sub-oxide. In the present invention, Si$^{n+}$ that is not Si$^{4+}$ in a barrier layer measured by ESCA is particularly called a sub-oxide.

The above results prove that a barrier layer formed from an oxide film with high sub-oxide ratio (for example, the hydroxide film (1) and silicon oxide film (2) described above) "allows the impurity to move in itself during heat treatment for gettering".

For gettering, an oxide film with high sub-oxide ratio is formed as a barrier layer on the crystalline semiconductor film and then a second semiconductor film serving as a gettering region is formed thereon. This way satisfactory gettering is achieved and the barrier layer also functions as an etching stopper in removal of the gettering region after the gettering step.

Figure 15:
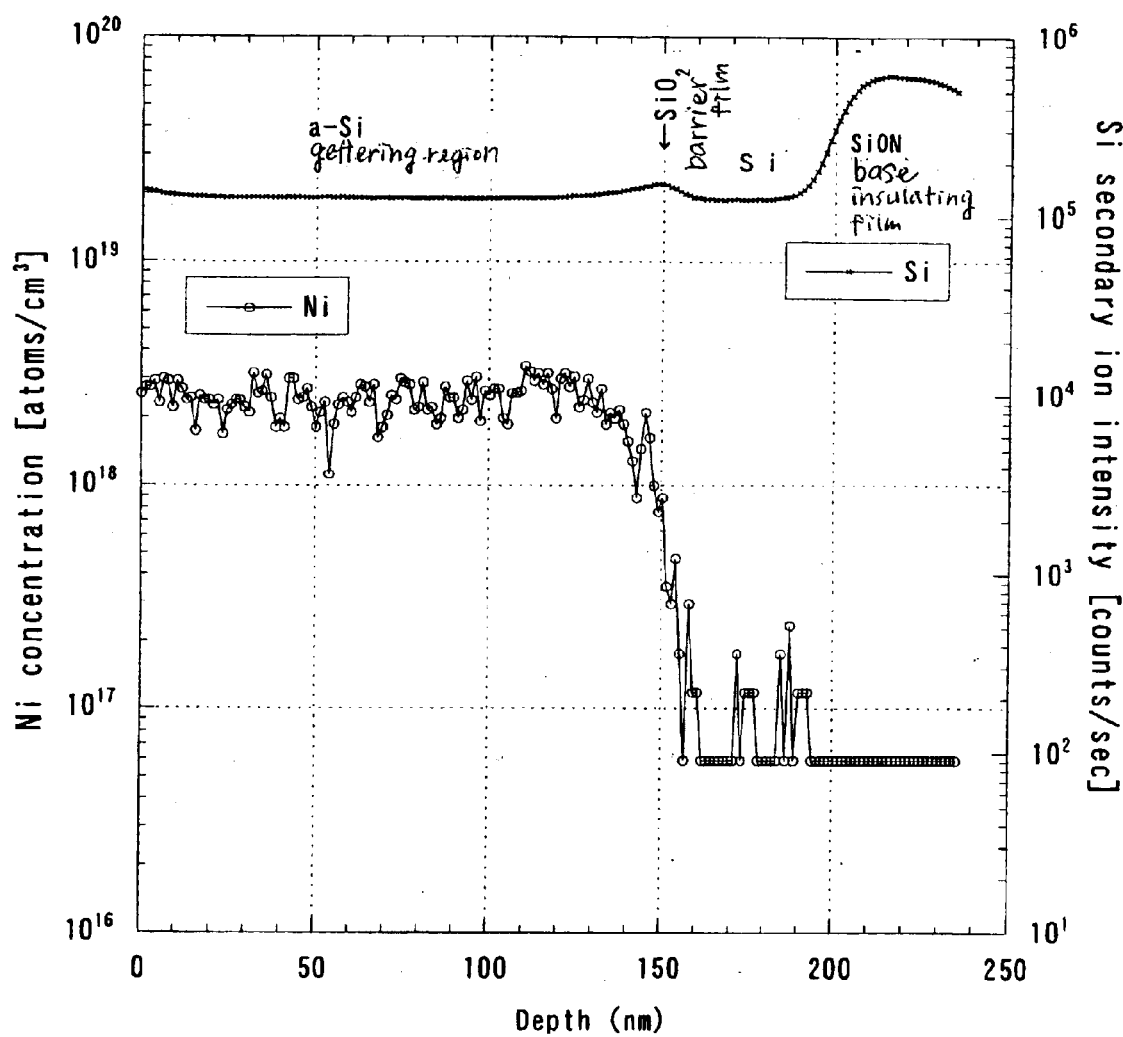
FIG. 15 is a graph showing measurement results by SIMS of a semiconductor layer of a semiconductor device that is manufactured by the present invention.

Distribution of the crystallization accelerating element (nickel here) in the silicon film is measured by SIMS after gettering that uses a barrier layer with high sub-oxide ratio of the present invention. The results are shown in FIG. 15. On the left of the graph, the axis of ordinate shows the concentration of nickel. The axis of abscissa shows the depth of the sample measured. The gettering region formed of amorphous silicon is about 0 to 140 nm deep from the top face of the sample. The barrier layer is about 140 to 150 nm deep. The crystalline semiconductor film is about 150 to 190 nm deep. The base insulating film is about 190 nm deep and lower.

In FIG. 15, the concentration of nickel used as a crystallization accelerating element is higher on the surface side of the silicon film (here it is the side opposite to the substrate, namely, the side where a gate insulating film is formed). Therefore it has been proved that the crystallization accelerating element distributed evenly throughout the silicon film is moved by gettering to the gettering region formed on the silicon film to make the nickel concentration higher on the surface side of the silicon film.

As described, gettering treatment using a barrier layer of the present invention can move a crystallization accelerating element from a semiconductor (silicon) film and provide a quality crystalline silicon film that has a crystallization accelerating element in reduced concentration.

Embodiment 2

A method of manufacturing a semiconductor device in accordance with the present invention will be described with reference to FIGS. 4A to 7B.

A substrate 10 may be a low alkali glass substrate or a quartz substrate. This embodiment employs a low alkali glass substrate. In this case, the substrate may be subjected in advance to heat treatment at a temperature 10 to 20° C. lower than the glass distortion point. On the surface of the substrate 10 where a TFT is formed, a silicon oxide film, a silicon nitride film, a silicon oxynitride film or the like is formed as a base insulating film 11 in order to prevent diffusion of impurities from the substrate 10. For example, the base insulating film 11 is a laminate of a base insulating film 11a, a 100 nm thick silicon oxynitride film formed by plasma CVD from SiH$_4$, NH$_3$, and N$_2$O, and a base insulating film 11b, a 200 nm thick silicon oxynitride film formed by plasma CVD from SiH$_4$ and N$_2$O.

Next, a semiconductor film 12 having an amorphous structure (an amorphous semiconductor film, typically, an amorphous silicon film) is formed by plasma CVD, sputtering, or other known methods to a thickness of 20 to 150 nm (preferably 30 to 80 nm). The amorphous semiconductor film 12 in this embodiment is an amorphous silicon film formed by plasma CVD to a thickness of 55 nm. Semiconductor films having an amorphous structure include amorphous semiconductor films and microcrystalline semiconductor films. The base insulating film 11 and the amorphous silicon film 12 can be formed by the same film formation method and therefore they may be formed in succession. If exposure to the air after the base insulating film 11 is formed is avoided, contamination of the surface of the base insulating film 11 can be prevented and characteristic fluctuation between TFTs to be manufactured as well as changes in threshold voltage can be reduced (FIG. 4A).

Then a semiconductor film including a crystal structure (in this embodiment, a crystalline silicon film) is formed. In crystallizing the amorphous silicon film 12, an element that accelerates crystallization (a catalytic element) (one or more kinds of elements selected from the group consisting of Ni, Co, Su, Pb, Pd, Fe, and Cu, typically, Ni) is used and a crystalline silicon film 14 is formed through heat treatment.

Specifically, a catalytic element-containing layer 13 is formed on the surface of the amorphous silicon film 12 and the substrate in this state is subjected to heat treatment to convert the amorphous silicon film 12 into the crystalline silicon film 14. The crystalline silicon film 14 may be a so-called single crystal silicon film or polysilicon film. The crystalline silicon film 14 formed. in this embodiment is a silicon film having grain boundaries.

Plasma doping, or a vapor method such as evaporation or sputtering, or application of a solution that contains a crystallization accelerating element may be used to dope the amorphous silicon film with a crystallization accelerating element. The method using a solution is easy to control the amount of a crystallization accelerating element used in doping and suitable for doping in minute amount.

When the crystallization method described above is combined with a laser crystallization method, the crystallinity of the crystalline semiconductor film can be enhanced. The laser employed for laser crystallization may be a pulse oscillation type or continuous wave KrF excimer laser, XeCl excimer laser, YAG laser, or YVO$_4$ laser. When one of these lasers is to be employed, laser light emitted from one of these laser oscillators is collected by an optical system into a linear shape before irradiating the semiconductor film. Crystallization conditions can be chosen to suit individual cases.

The surface of the semiconductor film irradiated with laser light is irregular. The unevenness is observed by an atomic force microscope (AFM) with the scan area set to 50 $\mu$m×50 $\mu$m. The observation has revealed that the surface roughness Ra of the film is 4.7 to 8.3 nm.

When the amorphous silicon film 12 is crystallized, atoms are rearranged and the film becomes dense. As a result, the thickness of the obtained crystalline silicon film 14 is reduced by about 1 to 15% of the initial thickness of the amorphous silicon film (55 nm, in this embodiment).

On the crystalline silicon film 14, a barrier layer 15 is formed. The barrier layer in this embodiment is a silicon oxide film formed by setting the film formation temperature to 400° C., the gas flow rate ratio SiH$_4$: N$_2$O to 4/800 (sccm), the pressure to 0.399×10$^2$ Pa, and the RF power density to 10/600 W/cm$_2$.

On the barrier layer 15, a second semiconductor film 16 is formed to serve as a gettering region. A silicon film can be used for the second semiconductor film 16. The second semiconductor film 16 is doped with a noble gas element to ensure sufficient gettering. To give an example of how to form a semiconductor film that contains a noble gas element as the gettering region 16, an amorphous silicon film is formed in an atmosphere containing a noble gas element using a silicon target. The noble gas element used is one or more kinds of elements selected from the group consisting of helium (He), neon (Ne), argon (Ar), krypton (Kr), and xenon (Xe). Argon (Ar) is particularly preferable since it is inexpensive.

Alternatively, the gettering region may be formed using a target containing an element which belongs to Group 15 (typically phosphorus or arsenic) or Group 13 (typically boron) in the periodic table and which has a gettering action. The gettering region may contain an element belonging to Group 15 (typically phosphorus or arsenic) and an element belonging to Group 13 (typically boron) in the periodic table.

The second semiconductor film (gettering region) 16 is removed by etching after the gettering step. Therefore, the film 16 has to be easy to remove and an amorphous semiconductor film having a large selective ratio with respect to the first semiconductor film (crystalline silicon film 14) in. etching is suitable as the film 16.

For gettering, the crystallization accelerating element (nickel) remaining in the crystalline silicon film 14 is moved by heat treatment to the gettering region 16 to thereby remove nickel or reduce the nickel concentration. The heat treatment for gettering is irradiation of intense light or heating in a furnace. Nickel has to be thoroughly gettered until almost no nickel is left in the crystalline silicon film 14, namely, until the nickel concentration in the film is lowered to 1×10$^{18}$/cm$^3$ or less, preferably, 1×10$^{17}$/cm$^3$ or less.

Next, the barrier layer 15 is used as an etching stopper to selectively remove the gettering region 16 alone. The barrier layer 15 is then removed using fluoric acid or the like.

The crystalline silicon film with its catalytic element concentration reduced as above is divided to have given shapes and form semiconductor layers 102 to 105.

The entire surfaces of the semiconductor layers 102 to 105 for forming an n-channel TFT may be doped with boron (B), an impurity element that gives the p type conductivity, in a concentration of 1×10$^{16}$ to 5×10$^{17}$/cm$^3$ in order to control the threshold voltage. Ion doping may be used to dope the layers with boron (B). Alternatively, boron (B) doping may be conducted at the same time the amorphous silicon film is formed. Although boron (B) doping is not always necessary, it is preferred since the threshold voltage of an n-channel TFT formed from the semiconductor layers 102 to 105 is within a given range if the layers are doped with boron (B).

Next, an insulating film containing silicon is formed as a gate insulating film 106 by plasma CVD or sputtering to a thickness of 10 to 150 nm. For example, a silicon oxynitride film with a thickness of 120 nm is formed. The gate insulating film 106 may be a single layer or laminate of other insulating films containing silicon.

Formed next arena conductive film (A). 107 and conductive film (B) 108 for forming a gate electrode. In this embodiment, a metal film as the conductive layer (B) 108 is laid on a conductive metal nitride film as the conductive layer (A) 107. The conductive layer (B) 108 is formed of an element selected from the group consisting of tantalum (Ta), titanium (Ti), molybdenum (Mo), and tungsten (W), or an alloy mainly containing one of the above-mentioned elements, or an alloy film containing a combination of the above-mentioned elements (typically a Mo—W alloy film or a Mo—Ta alloy film). The conductive layer (A) 107 is formed of tantalum nitride (TaN), tungsten nitride (WN), titanium nitride (TiN), or molybdenum nitride (MoN). Alternatively, the conductive layer (A) 107 may be formed of tungsten silicide, titanium silicide, or molybdenum silicide. The impurity concentration of the conductive layer (B) is preferably reduced to lower the resistance. In particular, it is preferable to reduce the oxygen concentration thereof to 30 ppm or less. For example, when the conductive layer (B) is a tungsten (W) film, a specific resistance of 20 $\mu\Omega$ cm or less is obtained by reducing the oxygen concentration of the layer to 30 ppm or lower.

The conductive layer (A) 107 is 10 to 50 nm (preferably 20 to 30 nm) in thickness. The conductive layer (B) 108 is 200 to 400 nm (preferably 250 to 350 nm) in thickness. In this embodiment, a tantalum nitride film with a thickness of 30 nm is used for the conductive layer (A) 107 and a W film with a thickness of 350 nm is used for the conductive layer (B) 108. Both of the conductive layers are formed by sputtering. When forming the films by sputtering, addition of an appropriate amount of Xe or Kr to Ar that is sputtering gas relieves the internal stress of the films to be formed and prevents the films from peeling off (FIG. 5A).

Next, resist masks 109 to 113 are formed for first etching treatment to form a gate electrode of each TFT as well as a capacitor wire. First etching conditions in this embodiment include employing ICP (inductively coupled plasma) etching, using as etching gas $CF_4$, $Cl_2$, and $O_2$, setting the gas flow rate ratio thereof to 25:25:10 (sccm), and giving an RF (13.56 MHz) power of 500 W to a coiled electrode at a pressure of 1 Pa to generate plasma. The substrate side (sample stage) also receives an RF (13.56 MHz) power of 150 W to apply a substantially negative self-bias voltage. The W film is etched under the first etching conditions to taper the first conductive layer around the edges.

The first etching conditions are switched to second etching conditions without removing the resist masks 109 to 113. The second etching conditions include using as etching gas $CF_4$ and $Cl_2$, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF (13.56 MHz) power of 20 W to apply a substantially negative self-bias voltage. Under the second etching conditions including the use of a mixture of $CF_4$ and $Cl_2$, the W film and the TaN film are etched to about the same degree. Through the above steps, first shape gate electrodes 114 to 116, a capacitor wire 117, and a source line 118 are formed from the conductive film (A) that is tapered around the edges and the conductive film (B).

Without removing the masks 109 to 113, the second etching treatment is conducted. In the second etching treatment, $CF_4$, $Cl_2$, and $O_2$ are used as etching gas, the gas flow rate ratio thereof is set to 20:20:20 (seem), and an RF (13.56 MHz) power of 500 W is applied to a coiled electrode at a pressure of 1 Pa to apply a substantially negative self-bias voltage. The W film is selectively etched in the second etching treatment.

Through the second etching treatment, the conductive films (A) 114a to 118a and the conductive films (B) 114b to 118b are etched to form second shape gate electrodes 119 to 121, a capacitor wire 122, and a source line 123.

Next, the resist masks 109 to 113 are removed and the semiconductor layers are doped with an n type impurity element. Using as masks the gate electrodes 119 to 122 that have been. formed by the second etching treatment, n type impurity regions 124 to 127 are formed. The concentration of the impurity element (phosphorus) in the obtained impurity regions 124 to 127 is set to $1\times10^{16}$ to $1\times10^{17}/cm^3$. (FIG. 6A)

Formed next for the second doping treatment are first masks 128 and 130 that cover the entire semiconductor layers 103 and 105 and a second mask 129 that covers the second shape conductive layer 121 on the semiconductor layer 104 as well as a part of the semiconductor layer 104. The second doping treatment produces, in the semiconductor layer 102, through the second shape. conductive layer 119a on the semiconductor layer 102, an n type impurity region 132 containing an n type impurity element in a second concentration and an n type impurity region 131 containing an n type impurity element in a third concentration. The second doping treatment also produces in the semiconductor layer 104 an n type impurity region 133 containing an n type impurity element in a third concentration. The phosphorus concentration is set to $1\times10^{17}$ to $1\times10^{19}/cm^3$ in the n type impurity region 132 containing an n type impurity element in a second concentration. The phosphorus concentration is set to $1\times10^{20}$ to $1\times10^{21}/cm^3$ in the n type impurity regions 131 and 133 containing an n type impurity element in a third concentration (FIG. 6B).

Although, as described above, the n type impurity region containing an n type impurity element in a second concentration and the n type impurity regions containing an n type impurity element in a third concentration are formed in one doping step in this embodiment, the doping step may be divided into two steps.

Next, masks 134 and 135 are formed to cover the entire semiconductor layers 102 and 104 in preparation for the third doping treatment. The third doping treatment uses diborane ($B_2H_6$) gas diluted with hydrogen or diborane gas diluted with noble gas to form in the semiconductor layers 103 and 105 p type impurity regions 136 and 138 containing a p type impurity element in a first concentration and p type impurity regions 137 and 139 containing a p type impurity element in a second concentration. The p type impurity regions 136 and 138 containing a p type impurity element in a first concentration contain boron in a concentration of $2\times10^{20}$ to $3\times10^2/cm^3$. The p type impurity regions 137 and 139 containing a p type impurity element in a second concentration are formed in regions overlapping the second taper shape conductive layers 120a and 122a, and contain boron in a concentration of $1\times10^{18}$ to $1\times10^{20}/cm^3$.

Figure 4D:
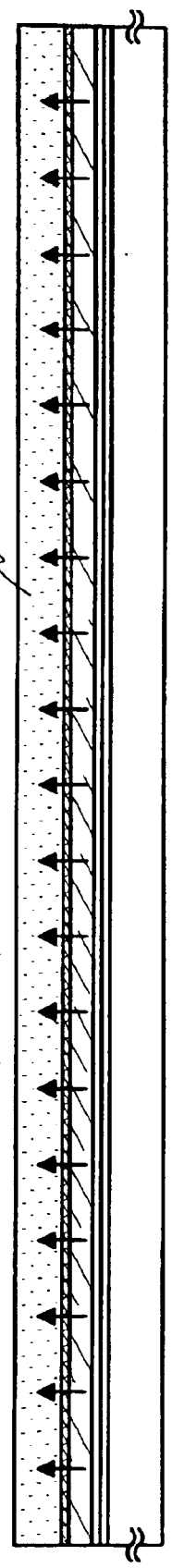

Through the above steps, n type impurity regions and p type impurity regions are formed in the respective semiconductor layers (FIG. 4D).

The masks 134 and 135 are then removed to form an inorganic interlayer insulating film 140. The inorganic interlayer insulating film 140 is a silicon nitride film, silicon oxide film, or silicon nitroxide film with a thickness of 50 to 500 nm (typically 100 to 300 nm). In this embodiment, a silicon oxynitride film is formed by plasma CVD to a thickness of 150 nm. The inorganic interlayer insulating film is not limited to the silicon oxynitride film and may be a single layer or laminate of other insulating films containing silicon.

The next step is activation of the impurity elements used to dope the semiconductor layers. The activation step employs furnace annealing. Thermal annealing is conducted at 400 to 700° C., typically 500 to 550° C. In this embodiment, the activation is achieved by four hour heat treatment at a temperature of 550° C. Instead of thermal annealing, laser annealing or rapid thermal annealing (RTA) may be employed.

The activation treatment may precede formation of the inorganic interlayer insulating film 140. However, when the material of the gate electrodes is weak against heat, it is desirable to put the activation treatment after formation of the interlayer insulating film (an insulating film mainly containing silicon, for example, a silicon nitride film) as in this embodiment in order to protect wires or the like.

Another heat treatment is conducted in an atmosphere containing 3 to 100% of hydrogen at 300 to 550° C. for 1 to 12 hours to hydrogenate the semiconductor layers. In this embodiment, the substrate receives heat treatment in a nitrogen atmosphere containing about 3% of hydrogen at 410° C. for an hour. This step is to terminate dangling bonds in the semiconductor layers using hydrogen that is contained in the interlayer insulating film. An example of other hydrogenation means is plasma hydrogenation (which uses hydrogen excited by plasma).

If laser annealing is used for the activation treatment, it is desirable to irradiate the semiconductor layers with laser light from an excimer laser, a YAG laser or the like after the hydrogenation described above.

Next, an organic interlayer insulating film 141 is formed from an organic insulating material on the inorganic interlayer insulating film 140. In this embodiment, an acrylic resin film with a thickness of 1.6 $\mu$m is formed. Then contact holes reaching the impurity regions are formed by patterning.

Thereafter, a transparent conductive film is formed to a thickness of 80 to 120 nm and is patterned to form a pixel electrode 142. The transparent conductive film may be formed of an indium oxide-zinc oxide alloy ($In_2O_3$—ZnO) or zinc oxide (ZnO). Zinc oxide doped with gallium (Ga) (ZnO:Ga) or the like in order to enhance the visible light transmittance and the conductivity may also be employed.

Wires 143 to 146 electrically connected to the impurity regions are formed in a driving circuit portion 205. These electrodes are formed by patterning a laminate of a 50 nm thick Ti film and a 500 nm thick alloy film (an Al—Ti alloy film).

Wires 147 to 150 are formed in a pixel portion 206 and are in contact with the impurity regions.

The pixel electrode 142 is electrically connected to the semiconductor layer 105 through the wire 149 (FIG. 7B).

In the example shown in this embodiment, the pixel electrode 142 is formed from a transparent conductive film. If the pixel electrode is formed from a reflective conductive material, a reflective display device can be manufactured. In this case, the pixel electrode can be formed at the same time the electrodes are formed. The material of this pixel electrode is desirably one having high reflectivity, such as a film mainly containing Al or Ag or a laminate of a film mainly containing Al and of a film mainly containing Ag.

In this way, TFTs for a driving circuit and a pixel TFT for a pixel portion can be formed on the same substrate. The driving circuit has an n-channel TFT 201 and a p-channel TFT 202. The pixel portion has a pixel TFT 203 and capacitor storage 204. In this specification, a substrate as such is called an active matrix substrate for conveniences' sake.

Figure 9:
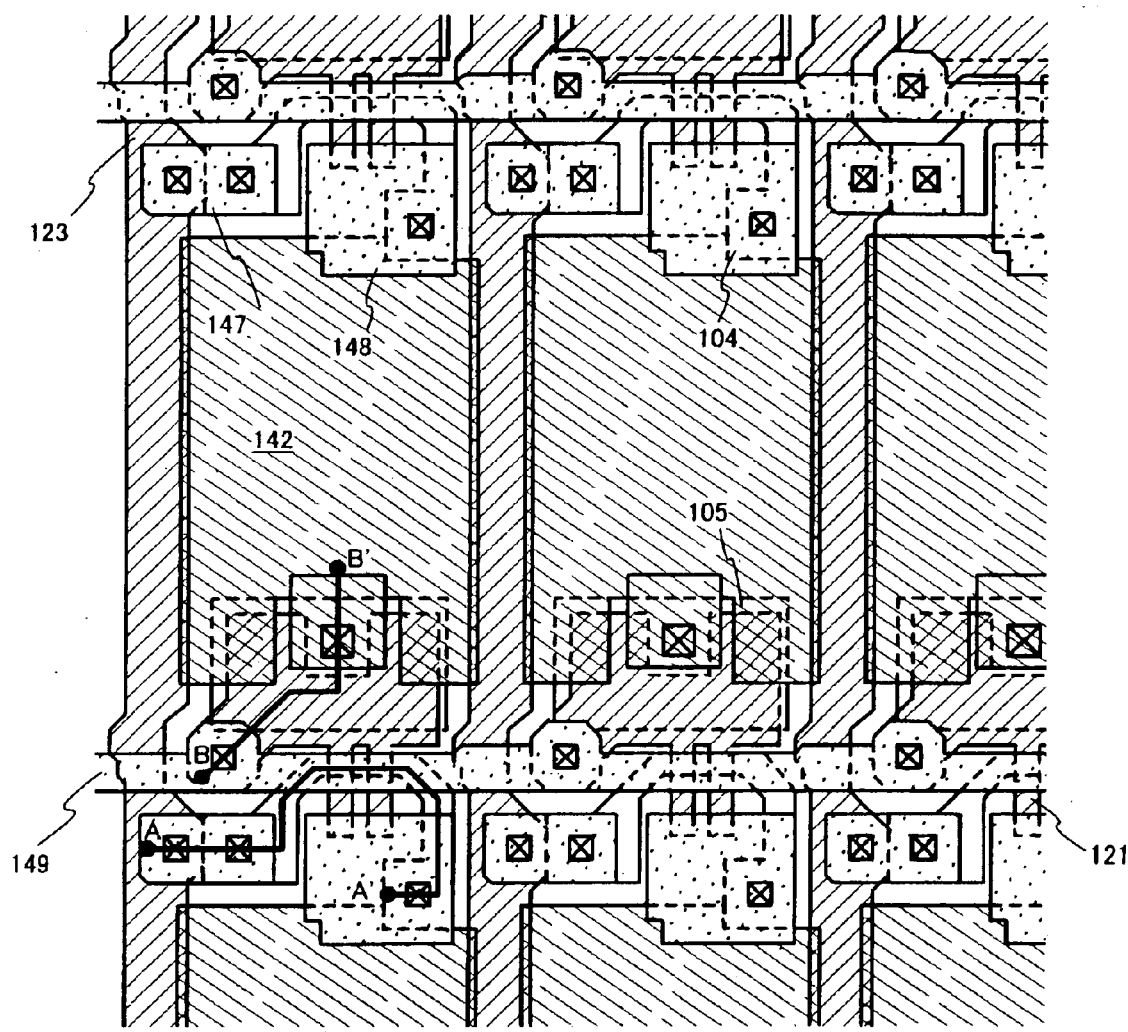
FIG. 9 is a top view of a pixel portion in a display device manufactured in accordance with the present invention.

FIG. 9 is a top view of the active matrix substrate manufactured through the above steps. The line A–A' in FIG. 9 corresponds to the line A–A' in FIG. 7B, and the semiconductor layer 104, the gate electrode 121, the wire 147, the gate line 149, and the source line 123 are located there. The line B–B' in FIG. 9 corresponds to the line B–B' in FIG. 7B, and located in there are the semiconductor layer 105, the pixel electrode 142, and the wire 150.

The n-channel TFT 201 of the driving circuit has in the island-like semiconductor layer 102 a channel formation region, the source and drain regions 131 (one serves as a source region and the other serves as a drain region), and the low concentration impurity region 132. The low concentration impurity region 132 overlaps the second shape gate electrode 119 and such impurity region is also called $L_{ov}$. The $L_{ov}$ region measures 0.5 to 3.0 $\mu$m, preferably 1.0 to 1.5 $\mu$m in the channel length direction. The TFT also has the gate electrode 119 that is a laminate of the conductive layer (A) 119a and the conductive layer (B) 119b.

The p-channel TFT 202 of the driving circuit has in the island-like semiconductor layer 103 a channel formation region, the source and drain regions 136 (one serves as a source region and the other serves as a drain region), and the impurity region 137. The TFT also has the gate electrode 120 that is a laminate of the conductive layer (A) 120a and the conductive layer (B) 120b.

The pixel TFT 203 of the pixel portion has in the island-like semiconductor layer 104 a channel formation region, the source and drain regions 133 (one serves as a source region and the other serves as a drain region), and the impurity region 126. The TFT also has the gate electrode 121 that is a laminate of the conductive layer (A) 121a and the conductive layer (B) 121b.

The capacitor storage 204 is composed of the capacitor wire 122, an insulating film formed from the same material as the gate insulating film, and the semiconductor layer 105 doped with a p type impurity element. The pixel TFT 203 in FIGS. 7A and 7B has a double gate structure but it may take a single gate structure or a multi-gate structure in which more than two gate electrodes are formed.

As described above, the present invention optimizes the structure of TFTs constituting a pixel portion and a driving circuit in accordance with specifications the respective circuits need. The present invention thus makes it possible to improve the operation performance and reliability of a semiconductor device.

Embodiment 3

This embodiment describes a process of manufacturing an active matrix liquid crystal display device (also called liquid crystal display panel) from the active matrix substrate that is manufactured in Embodiment 2. The description is given with reference to FIG. 8.

After the active matrix substrate shown in FIG. 7B is obtained in accordance with Embodiment 2, an oriented film 180 is formed on the active matrix substrate of FIG. 7B and receives rubbing treatment. In this embodiment, a columnar spacer 181 for keeping the gap between substrates is formed by patterning an acrylic resin film or other organic resin film prior to formation of the oriented film 180. Instead of the columnar spacer, spherical spacers may be sprayed onto the entire surface of the substrate.

An opposite substrate 182 is prepared next. Color layers 183 and 184 and a planarization film 185 are formed on the opposite substrate. The red color layer 183 and the blue color layer 184 partially overlap each other to form a second light-shielding portion. Though not shown in FIG. 8, the red color layer partially overlaps a green color layer to form a first light-shielding portion.

Subsequently, an opposite electrode 186 is formed in the pixel portion. An oriented film 187 is formed on the entire surface of the opposite substrate and receives rubbing treatment.

Figure 8:
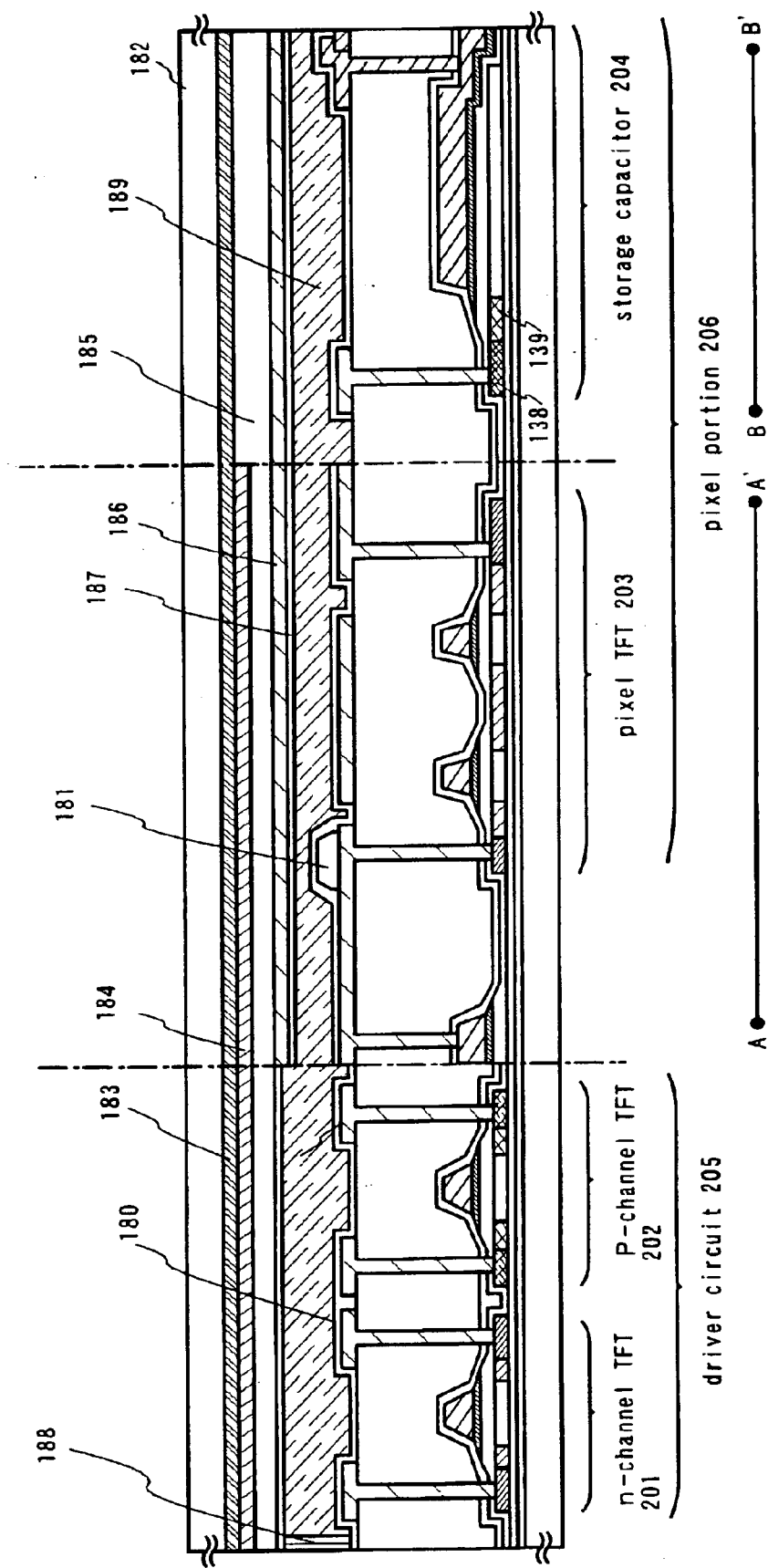
FIG. 8 is a diagram showing a process that is an embodiment of the present invention (Part 5)

The active matrix substrate on which the pixel portion and the driving circuit are formed is bonded to the opposite substrate with a seal member 188. The seal member 188 has a filler mixed therein, and the filler together with the columnar spacer keeps the distance between the two substrates uniform while the substrates are bonded. Thereafter, a liquid crystal material 189 is injected into the space between the substrates and is completely sealed with an end-sealing material (not shown in the drawing). The liquid crystal material 189 is a known liquid crystal material. The active matrix liquid crystal display device shown in FIG. 8 is thus completed. Then, if necessary, the active matrix substrate or the opposite substrate is divided into pieces of a given shape. A polarizing plate or the like is attached to the device by a known technique. Then a known technique is used to attach an FPC to the device.

Liquid crystal display panels manufactured as above can be used for display units of various electric appliances.

Embodiment 4

In this embodiment, the present invention is applied to a manufacturing process of a bottom gate TFT. A brief description will be given with reference to FIGS. 10A to 11C on a process of manufacturing a bottom gate TFT.

Figure 10A:
FIGS. 10A to 10E are diagrams showing an embodiment of the present invention (Part 1)

A silicon oxide film, silicon nitride film, silicon oxynitride film, or other insulating film (not shown in the drawing) is formed on a substrate 50. A conductive film for a gate electrode is formed and patterned to obtain a gate electrode 51. The conductive film is formed of an element selected from the group consisting of Ta, Ti, W, Mo, Cr, and Al, or it is a film mainly containing one of the above elements (FIG. 10A).

Figure 10B:
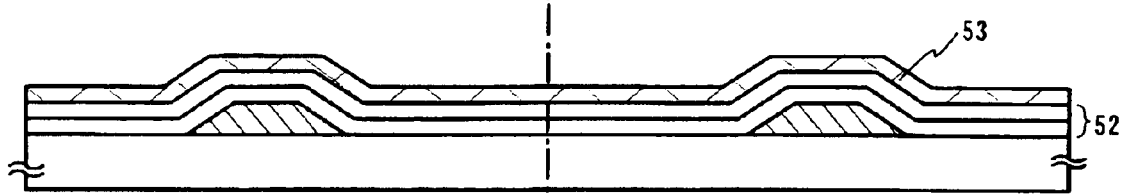

A gate insulating film 52 is formed next. The gate insulating film is a single layer of a silicon oxide film, a silicon nitride film, or a silicon oxynitride film, or a laminate of one of the above films (FIG. 10B).

Figure 10C:
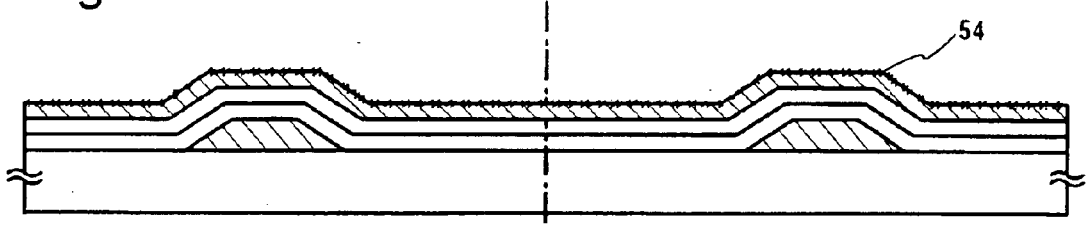

Next, an amorphous silicon film 53 as an amorphous semiconductor film is formed by thermal CVD, plasma CVD, reduced pressure CVD, evaporation, or sputtering to a thickness of 10 to 150 nm. The gate insulating film 52 and the amorphous silicon film 53 can be formed by the same film formation method and therefore may be formed in succession. By forming the films 52 and 53 successively, exposure to the air is avoided to prevent contamination of the surface and fluctuation in characteristic between TFTs to be manufactured as well as changes in threshold voltage can be reduced (FIG. 10C).

An element that accelerates crystallization is applied to the amorphous silicon film 53 to form a catalytic element-containing layer 54. The film is then subjected to heat treatment to form a crystalline silicon film 55.

After the crystallization step, a barrier layer 56 is formed on the crystalline silicon film 55. The barrier layer 56 is obtained by removing a natural oxide film naturally formed on the surface of the crystalline silicon film 55 and then subjecting the film to ozone water containing hydroxy radical. Here, the film is subjected to ozone water having a hydroxy concentration of 14 mg/l at room temperature for 60 seconds. The resultant barrier layer 56 is a silicon oxide film containing 18% or more sub-oxide.

Next, a second semiconductor film 57 containing a noble gas element is formed to serve as a gettering region. The semiconductor film 57 in this embodiment is formed by setting the flow rate of Ar to 50 sccm, the film formation pressure to 0.2 Pa, the power to 3 kW, and the substrate temperature to 150° C., and contains the noble gas element in a concentration of $1\times10^{19}$ to $1\times10^{22}/cm^3$, desirably $1\times10^{20}$ to $1\times10^{21}/cm^3$, more desirably $5\times10^{20}/cm^3$.

Figure 10D:
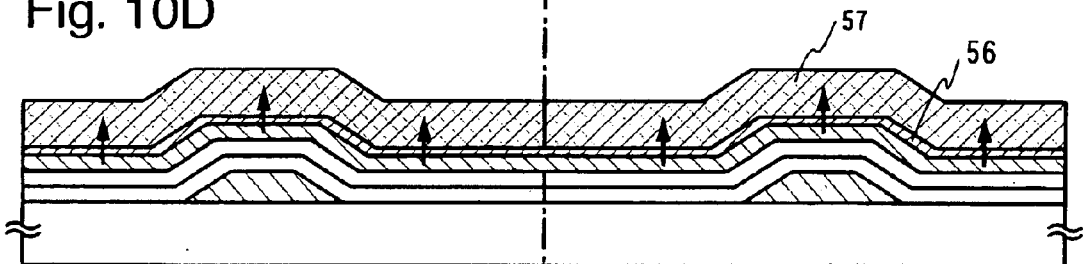

The crystallization accelerating element is moved (gettered) from the crystalline semiconductor film 55 to the gettering region 57 through heat treatment. The heat treatment may employ RTA or furnace annealing. Through the heat treatment, the catalytic element concentration in the crystalline semiconductor film 55 can be reduced down to $1\times10^{17}/cm^3$, or lower (FIG. 10D). After the gettering step, the gettering region (second semiconductor film) 57 is removed by etching and then barrier layer 56 is removed with fluoric acid or the like.

Next, an insulating film is formed as a mask 59 to avoid doping a region that later serves as a channel formation region with an impurity element in the subsequent impurity doping step. This insulating film is formed of silicon oxide. Then an insulating film 58 is formed to a thickness of 100 to 400 nm in order to protect the crystalline silicon film and control the concentration of impurities used for doping. The insulating film prevents direct exposure of the crystalline silicon film to plasma while the crystalline silicon film-is doped with an impurity element and makes subtle concentration control possible.

Figure 10E:
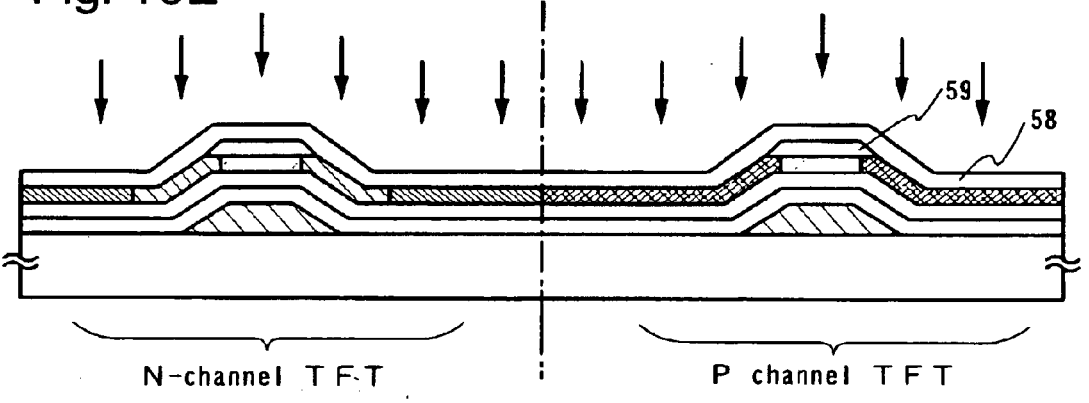

Using a resist mask, a part of the crystalline silicon film that later serves as an active layer of an n-channel TFT is doped with an impurity element that gives the n type conductivity and a part of the crystalline silicon film that later serves as an active layer of a p-channel TFT is doped with an impurity element that gives the p type conductivity. As a result, source regions, drain regions, and LDD regions are formed (FIG. 10E).

Figure 11A:
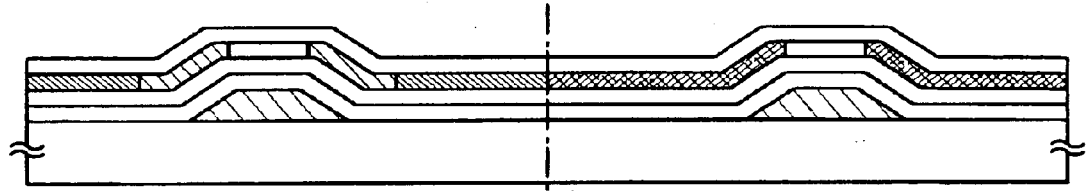
FIGS. 11A to 11C are diagrams showing an embodiment of the present invention (Part 2)
Figure 11B:
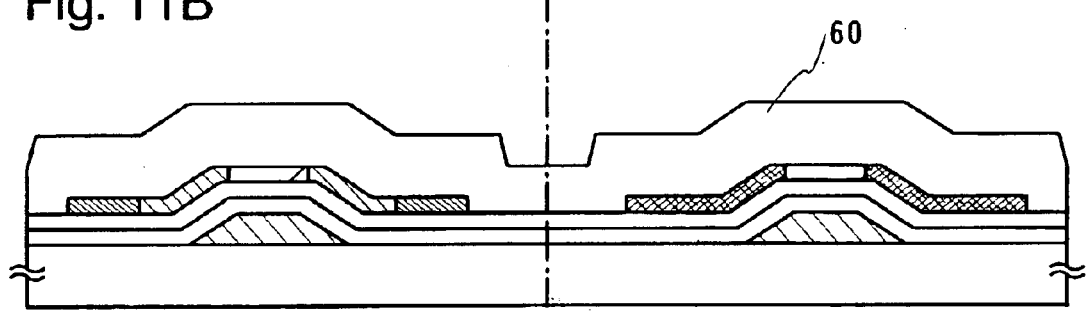

The next step is activation of the impurity elements used to dope the crystalline silicon film (FIG. 11A). Subsequently, the mask 59 and the insulating film 58 on the crystalline silicon film are removed and the crystalline silicon film is patterned to have the shape of the semiconductor layer 104 shown in FIG. 9, for example. Then, an interlayer insulating film 60 is formed. The interlayer insulating film is a silicon oxide film, silicon nitride film, silicon oxynitride film, or other insulating film with a thickness of 500 to 1500 nm (FIG. 11B).

Figure 11C:
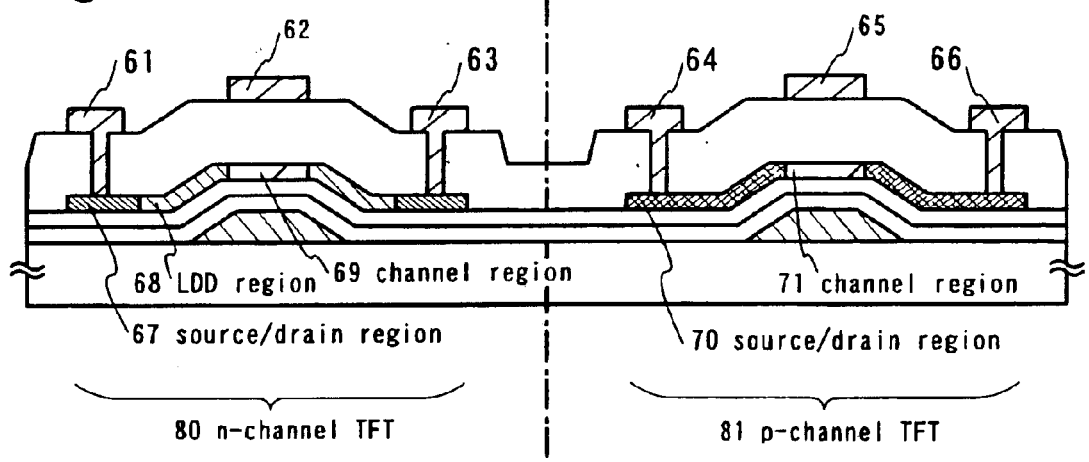

Contact holes reaching the source or drain regions of the TFTs are formed to form wires 61 to 66 for electrically connecting the TFTs to each other (FIG. 11C).

By applying the present invention as above, an n-channel TFT 80 (having the gate 51, the gate insulating film 52, a channel formation region 69, an LDD region 68, source and drain regions 67 (one serves as a source region and the other serves as a drain region), and the wires 61 to 63) and a p-channel TFT 81 (having the gate 51, the gate insulating film 52, a channel formation region 71, source and drain regions 70 (one serves as a source region and the other serves as a drain region), and the wires 64 to 66) are formed on the same substrate. The present invention is applicable to any TFT form.

Embodiment 5

The CMOS circuit and the pixel. portion formed by implementing the present invention can be used to an active matrix type liquid crystal display (liquid crystal display device). Thus, the present invention can be carried out at all electronic appliances into which these liquid crystal display device are incorporated.

Such electronic appliances include a video camera, a digital camera, a projector (a rear type projector or a front type projector), a head mounting display (a goggle type display), a personal computer, a potable information terminal (a mobile computer, a portable telephone, an electronic notebook, etc.), and the like. FIGS. 12A to 14C show examples of those.

Figure 12A:
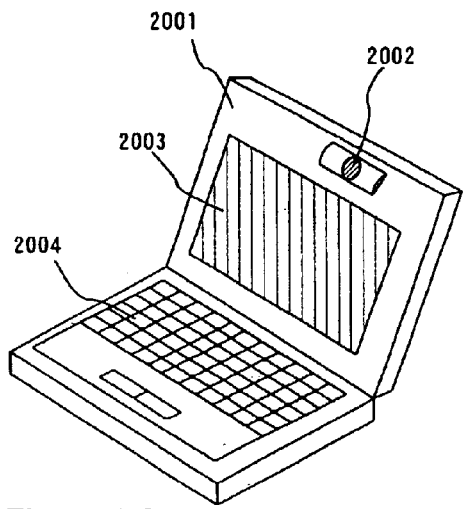
FIGS. 12A to 12F are diagrams showing examples of an electric appliance that uses as its display unit a display device manufactured by the present invention.

FIG. 12A shows a personal computer including a main body 2001, an image input portion 2002, a display portion 2003, a keyboard 2004 and the like.

Figure 12B:
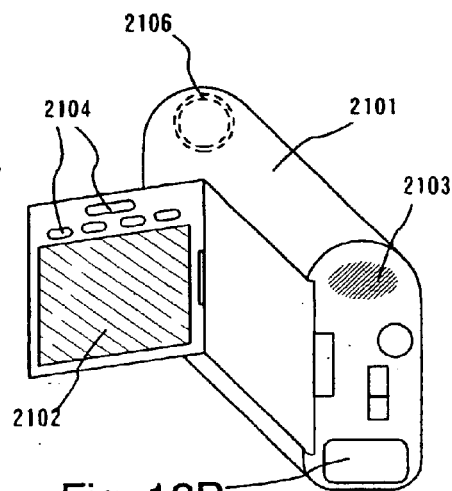

FIG. 12B shows a video camera including a main body 2101, a display portion 2102, a voice input portion 2103, operation switches 2104, a battery 2105, an image receiving portion 2106 and the like.

Figure 12C:
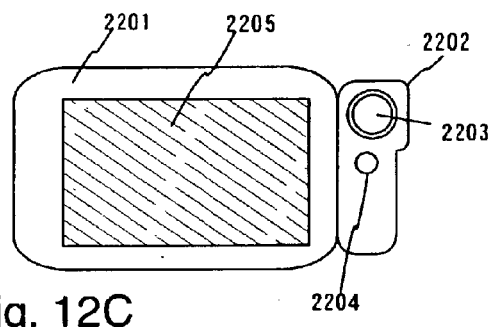

FIG. 12C shows a mobile computer including a main body 2201, a camera portion 2202, an image receiving portion 2203, an operation switch 2204, a display portion 2205 and the like.

Figure 12D:
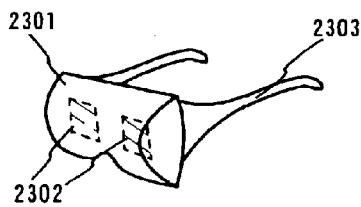

FIG. 12D shows a goggle type display. including a main body 2301, a display portion. 2302, an arm portion 2303 and the like.

Figure 12E:
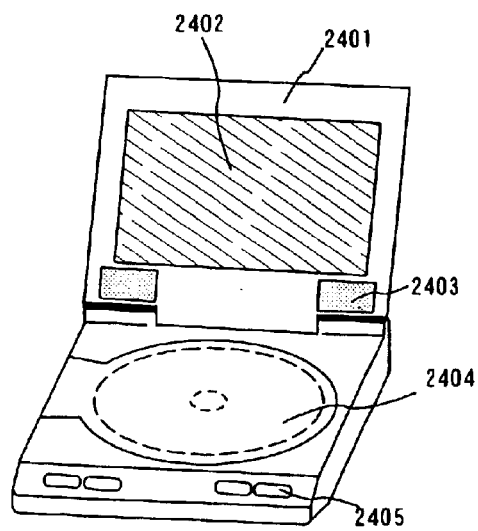

FIG. 12E shows a player using a record medium recorded with programs (hereinafter, referred to as record medium) including a main body 2401, a display portion 2402, a speaker portion 2403, a record medium 2404, an operation switch 2405 and the like. The player uses. DVD (Digital Versatile Disc), CD or the like as the record medium and can enjoy music, enjoy movie and carry out game or Internet.

Figure 12F:
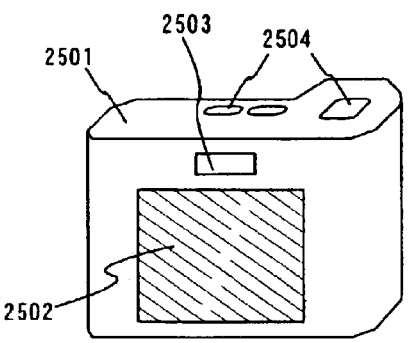

FIG. 12F shows a digital camera including a main body 2501, a display portion 2502, an eye contact portion 2503, operation switches 2504, an image receiving portion (not illustrated) and the like.

Figure 13A:
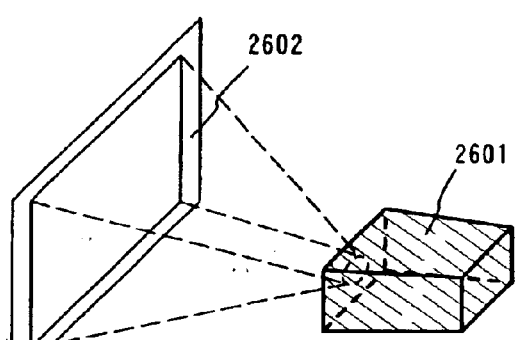
FIGS. 13A to 13D are diagrams showing examples of an electric appliance that uses as its display unit a display device manufactured by the present invention.

FIG. 13A shows a front type projector including a projection equipment 2601, a screen 2602 and the like.

Figure 13B:
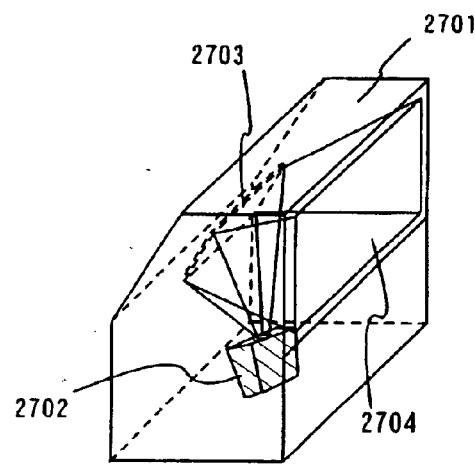

FIG. 13B shows a rear type projector including a main body 2701, a projection equipment 2702, a mirror 2703, a screen 2704 and the like.

Figure 13C:
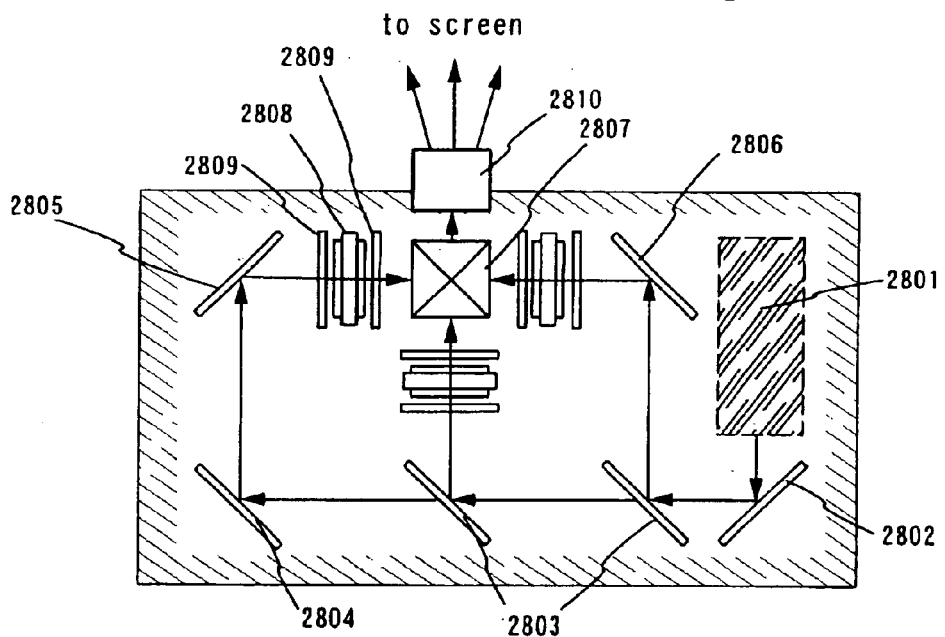

Further, FIG. 13C is a view showing an example of a structure of the projection equipment 2601 and 2702 in FIG. 13A and FIG. 13B. The projection equipment 2601 or 2702 is constituted by a light source optical system 2801, mirrors 2802, and 2804 through 2806, a dichroic mirror 2803, a prism 2807, a liquid crystal display device 2808, a phase difference plate 2809 and a projection optical system 2810. The projection optical system 2810 is constituted by an optical system including a projection lens. Although this example shows an example of three plates type, this example is not particularly limited thereto but may be of, for example, a single plate type. Further, person of executing this example may pertinently provide an optical system such as an optical lens, a film having a polarization function, a film for adjusting a phase difference or an IR film in an optical path shown by arrow marks in FIG. 13C.

Figure 13D:
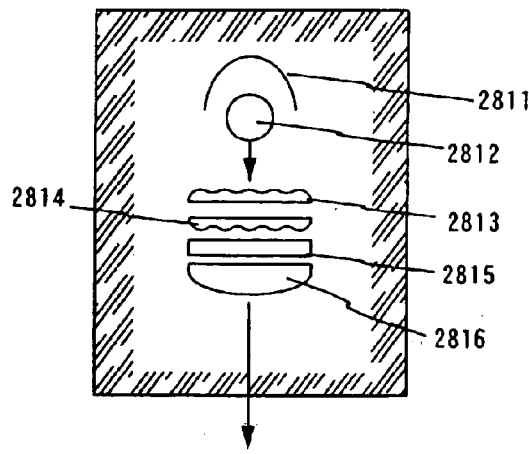

Further, FIG. 13D is a view showing an example of a structure of the light source optical system 2801 in FIG. 13C. According to this example, the light source optical system 2801 is constituted by a reflector 2811, a light source 2812, lens arrays 2813 and 2814, a polarization conversion element 2815 and a focusing lens 2816. Further, the light source optical system shown in FIG. 13D is only an example and this example is not particularly limited thereto. For example, a person of executing this example may pertinently provide an optical system such as an optical lens, a film having a polarization function, a film for adjusting a phase difference or an IR film and the like in the light source optical system.

However, according to the projectors shown in FIG. 13, there is shown a case of using a transmission type electro-optical device and an example of applying a reflection type electro-optical device is not illustrated.

Figure 14A:
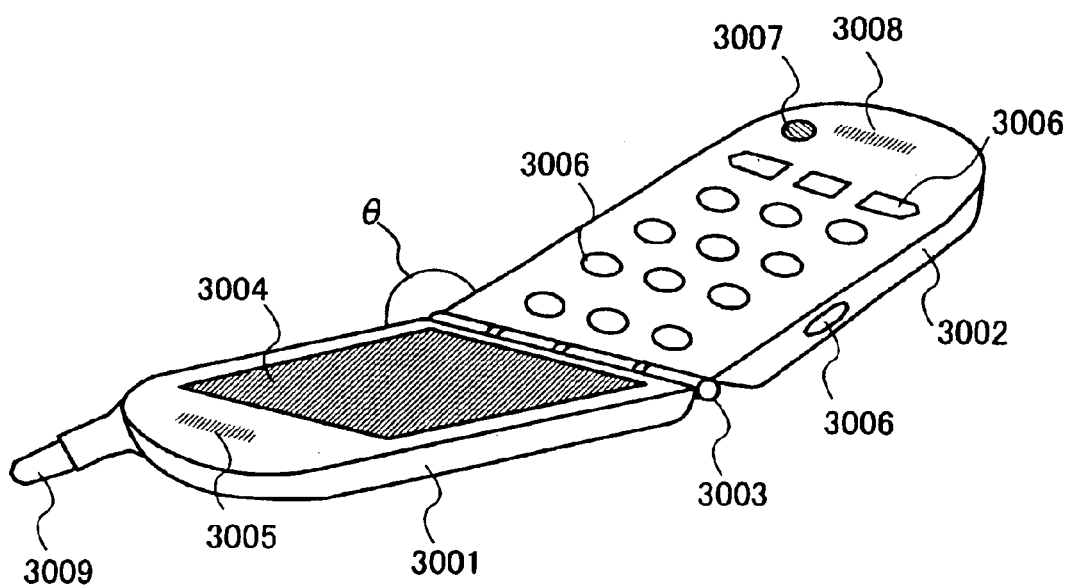
FIGS. 14A to 14C are diagrams showing examples of an electric appliance that uses as its display unit a display device manufactured by the present invention.

FIG. 14A shows a portable telephone including a display panel 3001, an operation panel 3002. The display panel 3001 and the operation panel 3002 are connected to each other in the connecting portion 3003. In the connecting portion 3003, the angle θ of a face which is provided the display portion 3004 of the display panel 3001 and a face which is provided the operation key 3006 of the operation panel 3002 can be changed arbitrary. Further, a voice output portion 3005, an operation key 3006, a power source switch 3007 and a sound input portion 3008 are also included.

Figure 14B:
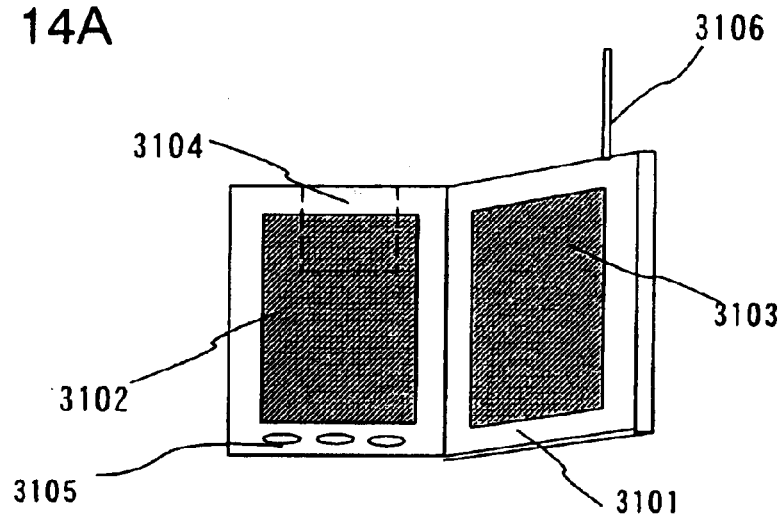

FIG. 14B shows a portable book (electronic notebook) including a main body 3101, display portion 3102, 3013, a record medium 3104, an operation switch 3105, an antenna 3106 and the like.

Figure 14C:
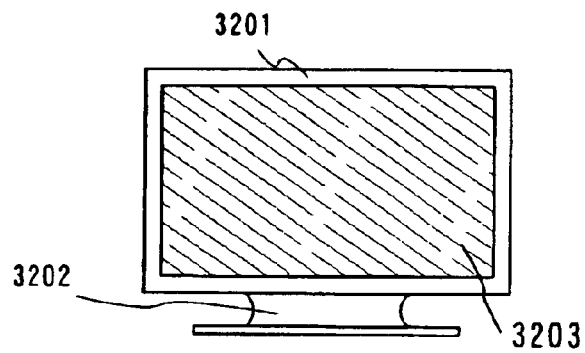

FIG. 14C shows a television including a main body 3201, a support base 3202, a display portion 3203 and the like.

As has been described, the range of applying the present invention is extremely wide and is applicable to electronic appliances of all the fields.

Application of the present invention makes it possible to form a barrier layer that meets three requirements, "withstand well against etching and protect a semiconductor film from an etchant as an etching stopper", "allow impurities to move in itself during heat treatment for gettering", and "have excellent reproducibility". When this barrier layer is used to getter an impurity element contained in a semiconductor film, a quality semiconductor film containing only a small amount of impurity element is obtained. When this quality semiconductor film is used to, manufacture a semiconductor device, the resultant semiconductor device has high reliability and excellent characteristics.

What is claimed is:

1. A method of manufacturing a semiconductor device, comprising:

forming a first amorphous semiconductor film on an insulator;

adding the first amorphous semiconductor film with an element that accelerates crystallization;

subjecting the film to first heat treatment to form a crystalline semiconductor film;

forming a barrier layer on the crystalline semiconductor film;

forming a second amorphous semiconductor film on the barrier layer; and gettering through second heat treatment the crystallization accelerating element contained in the crystalline semiconductor film, wherein the barrier layer is a film containing a sub-oxide, and wherein the ratio of the sub-oxide contained in the barrier layer is 18% or higher.

2. A method of manufacturing a semiconductor device according to claim 1, wherein the barrier layer is a silicon oxide film.

3. A method of manufacturing a semiconductor device according to claim 1, wherein the ratio of the sub-oxide contained in the barrier layer is measured by ESCA (Electron Spectroscopy for Chemical Analysis).

4. A method of manufacturing a semiconductor device according to claim 1, wherein the barrier layer is formed through oxidization by subjecting the surface of the crystalline semiconductor film to an aqueous solution that contains ozone.

5. A method of manufacturing a semiconductor device according to claim 1, wherein the barrier layer is formed by plasma CVD using $SiH_4$ gas and $N_2O$ gas as material gas.

6. A method of manufacturing a semiconductor device according to claim 1, wherein, after the first heat treatment, the crystalline semiconductor film is irradiated with laser light.

7. A method of manufacturing a semiconductor device according to claim 1, wherein, after the second heat treatment, the second semiconductor film is removed by etching and then the barrier layer is removed.

8. A method of manufacturing a semiconductor device according to claim 1, wherein the element that accelerates crystallization is one or more kinds of elements selected from the group consisting of Ni, Fe, Co, Sn, Pb, Ru, Rh, Pd, Os, Ir, Pt, Cu, and Au.

9. A method of manufacturing a semiconductor device, comprising:

forming a first amorphous semiconductor film on an insulator;

forming a mask insulating film on the first amorphous semiconductor film;

selectively adding the first amorphous semiconductor film with an element that accelerates crystallization;

subjecting the film to first heat treatment to form a crystalline semiconductor film;

forming a barrier layer on the crystalline semiconductor film;

forming a second amorphous semiconductor film on the barrier layer; and gettering through second heat treatment the crystallization accelerating element contained in the crystalline semiconductor film, wherein the barrier layer is a film containing a sub-oxide, and wherein the ratio if the sub-oxide contained in the barrier layer is 18% or higher.

10. A method of manufacturing a semiconductor device according to claim 9, wherein the barrier layer is a silicon oxide film.

11. A method of manufacturing a semiconductor device according to claim 9, wherein the ratio of the sub-oxide contained in the barrier layer is measured by ESCA (Electron Spectroscopy for Chemical Analysis).

12. A method of manufacturing a semiconductor device according to claim 9, wherein the barrier layer is formed through oxidization by subjecting the surface of the crystalline semiconductor film to an aqueous solution that contains ozone.

13. A method of manufacturing a semiconductor device according to claim 9, wherein the barrier layer is formed by plasma CVD using $SiH_4$ gas and $N_2O$ gas as material gas.

14. A method of manufacturing a semiconductor device according to claim 9, wherein, after the first heat treatment, the crystalline semiconductor film is irradiated with laser light.

15. A method of manufacturing a semiconductor device according to claim 9, wherein, after the second heat treatment, the second semiconductor film is removed by etching and then the barrier layer is removed.

16. A method of manufacturing a semiconductor device according to claim 9, wherein the element that accelerates crystallization is one or more kinds of elements selected from the group consisting of Ni, Fe, Co, Sn, Pb, Ru, Rh, Pd, Os, Ir, Pt, Cu, and Au.

17. A method of manufacturing a semiconductor device, comprising:

forming a first amorphous semiconductor film on an insulator;

adding the first amorphous semiconductor film with an element that accelerates crystallization subjecting the film to first heat treatment to form a crystalline semiconductor film;

forming a barrier layer on the crystalline semiconductor film;

forming a second amorphous semiconductor film on the barrier layer; and gettering through second heat treatment the crystallization accelerating element contained in the crystalline semiconductor film, wherein the barrier layer is an oxide film containing a sub-oxide, wherein the second amorphous semiconductor film contains an element that has a gettering action, and where in the ratio of the sub-oxide contained in the barrier layer is 18% or higher.

18. A method of manufacturing a semiconductor device according to claim 17, wherein the barrier layer is a silicon oxide film.

19. A method of manufacturing a semiconductor device according to claim 17, wherein the ratio of the sub-oxide contained in the barrier layer is measured by ESCA (Electron Spectroscopy for Chemical Analysis).

20. A method of manufacturing a semiconductor device according to claim 17, wherein the barrier layer is formed through oxidization by subjecting the surface of the crystalline semiconductor film to an aqueous solution that contains ozone.

21. A method of manufacturing a semiconductor device according to claim 17, wherein the barrier layer is formed by plasma CVD using $SiH_4$ gas and $N_2O$ gas as material gas.

22. A method of manufacturing a semiconductor device according to claim 17, wherein the element that has a gettering action is a noble gas element and is chosen from argon, xenon, krypton, and neon.

23. A method of manufacturing a semiconductor device according to claim 17, wherein the element that has a gettering action is an element belonging to Group 15 in the periodic table.

24. A method of manufacturing a semiconductor device according to claim 17, wherein the element that has a gettering action is an element belonging to Group 15 in the periodic table and an element belonging to Group 13 in the periodic table.

25. A method of manufacturing a semiconductor device according to claim 17, wherein, after the first heat treatment, the crystalline semiconductor film is irradiated with laser light.

26. A method of manufacturing a semiconductor device according to claim 17, wherein, after the second heat treatment, the second semiconductor film is removed by etching and then the barrier layer is removed.

27. A method of manufacturing a semiconductor device according to claim 17, wherein the element that accelerates crystallization is one or more kinds of elements selected from the group consisting of Ni, Fe, Co, Sn, Pb, Ru, Rh, Pd, Os, Ir, Pt, Cu, and Au.

28. A method of manufacturing a semiconductor device, comprising:

forming a first amorphous semiconductor film on an insulator;

forming a mask insulating film on the first amorphous semiconductor film;

selectively adding the first amorphous semiconductor film with an element that accelerates crystallization;

subjecting the film to first heat treatment to form a crystalline semiconductor film;

forming a barrier layer on the crystalline semiconductor film;

forming a second amorphous semiconductor film on the barrier layer; and gettering through second heat treatment the crystallization accelerating element contained in the crystalline semiconductor film, wherein the barrier layer is an oxide film containing a sub-oxide, wherein the second amorphous semiconductor film contains an element that has a gettering action, and wherein the ratio of the sub-oxide contained in the barrier layer is 18% or higher.

29. A method of manufacturing a semiconductor device according to claim 28, wherein the barrier layer is a silicon oxide film.

30. A method of manufacturing a semiconductor device according to claim 28, wherein the ratio of the sub-oxide contained in the barrier layer is measured by ESCA (Electron Spectroscopy for Chemical Analysis).

31. A method of manufacturing a semiconductor device according to claim 28, wherein the barrier layer is formed through oxidization by subjecting the surface of the crystalline semiconductor film to an aqueous solution that contains ozone.

32. A method of manufacturing a semiconductor device according to claim 28, wherein the barrier layer is formed by plasma CVD using $SiH_4$ gas and $N_2O$ gas as material gas.

33. A method of manufacturing a semiconductor device according to claim 28, wherein the element that has a gettering action is a noble gas element and is chosen from argon, xenon, krypton, and neon.

34. A method of manufacturing a semiconductor device according to claim 28, wherein the element that has a gettering action is an element belonging to Group 15 in the periodic table.

35. A method of manufacturing a semiconductor device according to claim 28, wherein the element that has a gettering action is an element belonging to Group 15 in the periodic table and an element belonging to Group 13 in the periodic table.

36. A method of manufacturing a semiconductor device according to claim 28, wherein, after the first heat treatment, the crystalline semiconductor film is irradiated with laser light.

37. A method of manufacturing a semiconductor device according to claim 28, wherein, after the second heat treatment, the second semiconductor film is removed by etching and then the barrier layer is removed.

38. A method of manufacturing a semiconductor device according to claim 28, wherein the element that accelerates crystallization is one or more kinds of elements selected from the group consisting of Ni, Fe, Co, Sn, Pb, Ru, Rh, Pd, Os, Ir, Pt, Cu, and Au.

* * * * *